(12) United States Patent
Hemiller et al.

(10) Patent No.: US 9,928,760 B2
(45) Date of Patent: Mar. 27, 2018

(54) DISPLAY MODULE MOUNTING

(71) Applicant: Daktronics, Inc., Brookings, SD (US)

(72) Inventors: Ryan Hemiller, Brookings, SD (US); Ryan J. Nielsen, Brookings, SD (US); Shannon Lee Mutschelknaus, Aurora, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 15/446,814

(22) Filed: Mar. 1, 2017

(65) Prior Publication Data

US 2017/0193864 A1   Jul. 6, 2017

Related U.S. Application Data

(63) Continuation of application No. 13/928,654, filed on Jun. 27, 2013, now Pat. No. 9,644,823.
(Continued)

(51) Int. Cl.
*G09F 9/302* (2006.01)
*H05K 1/18* (2006.01)
*H05K 7/14* (2006.01)

(52) U.S. Cl.
CPC ............ *G09F 9/3026* (2013.01); *H05K 1/181* (2013.01); *H05K 7/14* (2013.01); *H05K 2201/10106* (2013.01)

(58) Field of Classification Search
CPC ...... G09F 9/33; G09F 9/3026; G09F 15/0068; G06F 3/1446; G01J 3/28; F21V 21/088
See application file for complete search history.

(56) References Cited

U.S. PATENT DOCUMENTS 5,465,191 A   11/1995   Nomura et al.
6,813,853 B1  11/2004   Tucker
(Continued)

FOREIGN PATENT DOCUMENTS

AU   2013280275       3/2017
AU   2013280215 B2    7/2017
(Continued)

OTHER PUBLICATIONS

"U.S. Appl. No. 13/928,654, Advisory Action dated Aug. 7, 2015", 3 pgs.
(Continued)

*Primary Examiner* — Anabel Ton
(74) *Attorney, Agent, or Firm* — Schwegman Lundberg & Woessner, P.A.

(57) ABSTRACT

A display module comprises a circuit board including a plurality of light-emitting elements, a frame having a first face coupled with the circuit board and a second face, one or more first securing structures coupled to the second face, and one or more mounting hooks with a first hook portion coupled to and extending generally rearward from the second face and a second hook portion extending generally downward from the first hook portion. The first securing structures are actuable between an engaged configuration wherein the first securing structures mount or secure the display module to a support structure to at least partially support a display module weight, and a disengaged configuration wherein the display module is not secured to the support structure by the first securing structures, and wherein the mounting hooks at least partially support the display module weight when the first securing structures are in the disengaged configuration.

20 Claims, 14 Drawing Sheets

Related U.S. Application Data

(60) Provisional application No. 61/665,579, filed on Jun. 28, 2012.

(56) References Cited

U.S. PATENT DOCUMENTS

| | | | |
|---|---|---|---|
| 6,816,389 B1 | 11/2004 | Lutz et al. | |
| 6,950,313 B1 | 9/2005 | Shih | |
| 7,055,271 B2 | 6/2006 | Lutz et al. | |
| 7,864,516 B2 | 1/2011 | Lee et al. | |
| 8,104,204 B1 * | 1/2012 | Syrstad | G09F 9/33 40/544 |
| 8,154,864 B1 * | 4/2012 | Nearman | G09F 9/33 165/104.33 |
| 8,197,088 B2 * | 6/2012 | Patterson | G06F 3/1446 362/249.02 |
| 8,414,149 B2 | 4/2013 | Nearman | |
| 9,612,004 B2 | 4/2017 | Hemiller et al. | |
| 9,644,823 B2 | 5/2017 | Hemiller et al. | |
| 2003/0217495 A1 | 11/2003 | Nagamine et al. | |
| 2005/0052374 A1 | 3/2005 | Devos et al. | |
| 2005/0212717 A1 | 9/2005 | Baumstark | |
| 2006/0279493 A1 | 12/2006 | Syrstad | |
| 2008/0060234 A1 | 3/2008 | Chou | |
| 2008/0266206 A1 | 10/2008 | Nelson et al. | |
| 2009/0009998 A1 * | 1/2009 | Malstrom | G09F 9/3026 362/249.01 |
| 2009/0266206 A1 * | 10/2009 | Hsu | B25B 23/1425 81/479 |
| 2014/0003050 A1 | 1/2014 | Hemiller et al. | |
| 2014/0003052 A1 | 1/2014 | Hemiller et al. | |
| 2014/0160363 A1 | 6/2014 | Mutschelknaus et al. | |
| 2017/0178549 A1 | 6/2017 | Hemiller et al. | |

FOREIGN PATENT DOCUMENTS

| | | |
|---|---|---|
| CN | 1595244 A | 3/2005 |
| CN | 101454524 A | 6/2009 |
| CN | 101515480 A | 8/2009 |
| CN | 101689337 A | 3/2010 |
| CN | 102402909 A | 4/2012 |
| CN | 102402910 A | 4/2012 |
| CN | 102402911 A | 4/2012 |
| CN | 202275567 U | 6/2012 |
| EP | 1515297 A1 | 3/2005 |
| EP | 1524640 A2 | 4/2005 |
| EP | 1580709 B1 | 9/2006 |
| EP | 2867882 B1 | 8/2016 |
| EP | 2867883 B1 | 8/2016 |
| JP | 2002366061 A | 12/2002 |
| WO | WO-2009152524 A2 | 12/2009 |
| WO | WO-2013060081 A1 | 5/2013 |
| WO | WO-2014004788 A1 | 1/2014 |
| WO | WO-2014004820 A1 | 1/2014 |

OTHER PUBLICATIONS

"U.S. Appl. No. 13/928,654, Examiner Interview Summary dated Jan. 30, 2015", 3 pgs.
"U.S. Appl. No. 13/928,654, Final Office Action dated May 7, 2015", 24 pgs.
"U.S. Appl. No. 13/928,654, Non Final Office Action dated Jun. 3, 2016", 25 pgs.
"U.S. Appl. No. 13/928,654, Non Final Office Action dated Oct. 24, 2014", 20 pgs.
"U.S. Appl. No. 13/928,654, Notice of Allowance dated Dec. 2, 2016", 8 pgs.
"U.S. Appl. No. 13/928,654, Preliminary Amendment dated Jul. 1, 2013", 7 pgs.
"U.S. Appl. No. 13/928,654, Response filed Jan. 26, 2015 to Non Final Office Action dated Oct. 24, 2014", 14 pgs.
"U.S. Appl. No. 13/928,654, Response filed Jul. 7, 2015 to Final Office Action dated May 7, 2015", 13 pgs.
"U.S. Appl. No. 13/928,654, Response filed Oct. 3, 2016 to Non Final Office Action dated Jun. 3, 2016", 15 pgs.
"U.S. Appl. No. 13/928,968, Advisory Action dated Jul. 19, 2016", 3 pgs.
"U.S. Appl. No. 13/928,968, Corrected Notice of Allowance dated Jan. 20, 2017", 2 pgs.
"U.S. Appl. No. 13/928,968, Corrected Notice of Allowance dated Feb. 10, 2017", 2 pgs.
"U.S. Appl. No. 13/928,968, Corrected Notice of Allowance dated Dec. 27, 2016", 2 pgs.
"U.S. Appl. No. 13/928,968, Final Office Action dated Mar. 31, 2016", 18 pgs.
"U.S. Appl. No. 13/928,968, Non Final Office Action dated Sep. 14, 2015", 18 pgs.
"U.S. Appl. No. 13/928,968, Notice of Allowance dated Nov. 16, 2016", 9 pgs.
"U.S. Appl. No. 13/928,968, Preliminary Amendment filed Jul. 1, 2013", 7 pgs.
"U.S. Appl. No. 13/928,968, Response filed Jan. 11, 2016 to Non Final Office Action dated Sep. 14, 2015", 29 pgs.
"U.S. Appl. No. 15/448,328, Non Final Office Action dated Jul. 6, 2017", 13 pgs.
"U.S. Appl. No. 15/448,328, Preliminary Amendment filed Mar. 3, 2017", 8 pgs.
"Australian Application Serial No. 2013280215, Office Action dated Nov. 11, 2016", 2 pgs.
"Australian Application Serial No. 2013280275, First Examiner Report dated Jun. 8, 2016", 3 pgs.
"Australian Application Serial No. 2013280275, Response filed Oct. 17, 2016 to First Examiner Report dated Jun. 8, 2016", 14 pgs.
"Australian Application Serial No. 2641117, Response filed Jan. 20, 2017 to First Examiner Report dated Nov. 11, 2016", 12 Pgs.
"Chinese Application Serial No. 201380044787.5, Office Action mailed Mar. 15, 2017", w/ English Claims, 7 pgs.
"Chinese Application Serial No. 201380044787.5, Office Action dated Jul. 20, 2016", w/ English Translation, 22 pgs.
"Chinese Application Serial No. 201380044787.5, Response filed May 27, 2017 to Office Action dated Mar. 15, 2017", 9 pgs.
"Chinese Application Serial No. 201380044787.5, Response filed Dec. 5, 2016 to Office Action dated Jul. 20, 2016", W/ English Claims, 12 pgs.
"Chinese Application Serial No. 201380044798.3, Office Action dated Feb. 6, 2017", With English Translation, 16 pgs.
"Chinese Application Serial No. 201380044798.3, Office Action dated Jun. 2, 2016", With English Translation, 20 pgs.
"Chinese Application Serial No. 201380044798.3, Response filed Apr. 21, 2017 to Office Action dated Feb. 6, 2017", w/ English Claims, 12 pgs.
"Chinese Application Serial No. 201380044798.3, Response filed Oct. 17, 2016 to Office Action dated Jun. 2, 2016", w/ English Claims, 13 pgs.
"European Application Serial No. 13734940.3, Communication under Rule 71(3) dated Jan. 7, 2016", 66 pgs.
"European Application Serial No. 13734940.3, Office Action dated Mar. 25, 2015", 2 pgs.
"European Application Serial No. 13734940.3, Response filed Sep. 16, 2015 to Office Action dated Mar. 25, 2015", 69 pgs.
"European Application Serial No. 13737917.8, Communication under Rule 71(3) dated Jan. 12, 2016", 79 pgs.
"European Application Serial No. 13737917.8, Office Action dated Mar. 25, 2015", 2 pgs.
"European Application Serial No. 13737917.8, Response filed Sep. 25, 2015 to Office Action dated Mar. 25, 2015", 23 pgs.
"European Application Serial No. 16182273.9, Extended European Search Report dated Nov. 7, 2016", 8 pgs.
"International Application Serial No. PCT/US2013/048121, International Preliminary Report on Patentability dated Jan. 8, 2015", 7 pgs.
"International Application Serial No. PCT/US2013/048121, International Search Report dated Sep. 26, 2013", 6 pgs.
"International Application Serial No. PCT/US2013/048121, Written Opinion dated Sep. 26, 2013", 6 pgs.

(56) References Cited

OTHER PUBLICATIONS

"International Application Serial No. PCT/US2013/048167, International Preliminary Report on Patentability dated Jan. 8, 2015", 6 pgs.
"International Application Serial No. PCT/US2013/048167, International Search Report dated Sep. 30, 2013", 6 pgs.
"International Application Serial No. PCT/US2013/048167, Written Opinion dated Sep. 30, 2013", 4 pgs.
Mutschelknaus, Shannon Lee, et al., "Encapsulation of Light-Emitting Elements on a Display Module", U.S. Appl. No. 61/735,346, filed Dec. 10, 2012, 32 pgs.
U.S. Appl. No. 13/928,654, filed Jun. 27, 2013, Display Module Mounting, now U.S. Pat. No. 9,644,823.
U.S. Appl. No. 13/928,968, filed Jun. 27, 2013, Display Module Mounting, now U.S. Pat. No. 9,612,004.
U.S. Appl. No. 15/448,328, filed Mar. 2, 2017, Display Module Mounting.

\* cited by examiner

DISPLAY MODULE MOUNTING

CLAIM OF PRIORITY

This application is a continuation of and claims the benefit of priority to U.S. application Ser. No. 13/928,654, entitled "DISPLAY MODULE MOUNTING," filed on Jun. 27, 2013, which claims the benefit of priority to U.S. Provisional Patent Application Ser. No. 61/665,579, entitled "DISPLAY MODULE MOUNTING," filed on Jun. 28, 2012, the disclosures of each of which are hereby incorporated by reference herein in their entirety.

BACKGROUND

Some examples of light-emitting diode (LED) display modules incorporate an arrangement of different colored LEDs, such as red-green-blue LED pixel packages. The LED pixel packages or other LED arrangements can be coupled to, and extend from, a circuit board. The circuit board, with the coupled LEDs, can be mounted to a frame to form an LED module. A plurality of LED modules can be mounted to a cabinet or support chassis in close proximity to form a larger LED display such that when the plurality of LED modules are operated together, the resulting LED display appears to be a single, continuous display.

SUMMARY

This patent document discloses, among things, an LED module and an LED display formed from a plurality of modules where each individual LED module can be easily mounted onto, or dismounted from, a support chassis by an installer user without the LED module contacting or otherwise interfering with one or more adjacently-positioned LED modules mounted to the support chassis. A frame of an LED module can include one or more translating structures that are each configured to engage a feature of the support chassis to effectuate a translation of the LED module to avoid contact with each adjacently-positioned LED module during mounting of the LED module to, or dismounting the LED module from the support chassis. The translating structures can lift and translate the LED module being mounted or dismounted so that the LED module does not contact adjacently-positioned LED modules. The frame can further include one or more securing structures, such as one or more mounting hooks, configured for mounting or securing the LED module to the support chassis.

This disclosure describes a frame for an LED module comprising a first face configured for coupling with an LED circuit board, a second face configured for mounting to a support chassis, one or more translating structures coupled to the second face, each translating structure configured to engage a feature of the support chassis effectuating a translation of the LED module to avoid contact or interference with an adjacently-positioned LED module, mounted to the support chassis, during a mounting or a dismounting procedure, and one or more securing structures configured for mounting or securing the frame to the support chassis.

This disclosure also describes an LED module comprising a circuit board including a plurality of LEDs, and a frame having a first face coupled with the circuit board and a second face including at least one securing structure, configured for mounting or securing the frame to a support chassis, and one or more translating structures, configured to engage one or more features of the support chassis effectuating a translation of the LED module to avoid contact with an adjacently-positioned LED module, mounted to the support chassis, when installing or uninstalling the LED module.

These and other examples and features of the present display module mounting configurations and related methods will be set forth, in part, in the following Detailed Description. This Summary is intended to provide an overview of subject matter of the present disclosure—it is not intended to provide an exclusive or exhaustive explanation. The Detailed Description below is included to provide further information about the present disclosure.

BRIEF DESCRIPTION OF THE DRAWINGS

In the drawings, like numerals can be used to describe similar elements throughout the several views. Like numerals having different letter suffixes can be used to represent different views of similar elements. The drawings illustrate generally, by way of example, but not by way of limitation, various examples discussed in the present document.

DETAILED DESCRIPTION

In the following Detailed Description, reference is made to the accompanying drawings which form a part hereof. The drawings show, by way of illustration, specific examples in which the present display module mounting configurations and related methods can be practiced. These examples are described in sufficient detail to enable those skilled in the art to practice, and it is to be understood that other embodiments can be utilized and that structural changes can be made without departing from the scope of the present disclosure. Therefore, the following Detailed Description is not to be taken in a limiting sense, and the scope of the present disclosure is defined by the appended claims and their equivalents.

Figure 1:
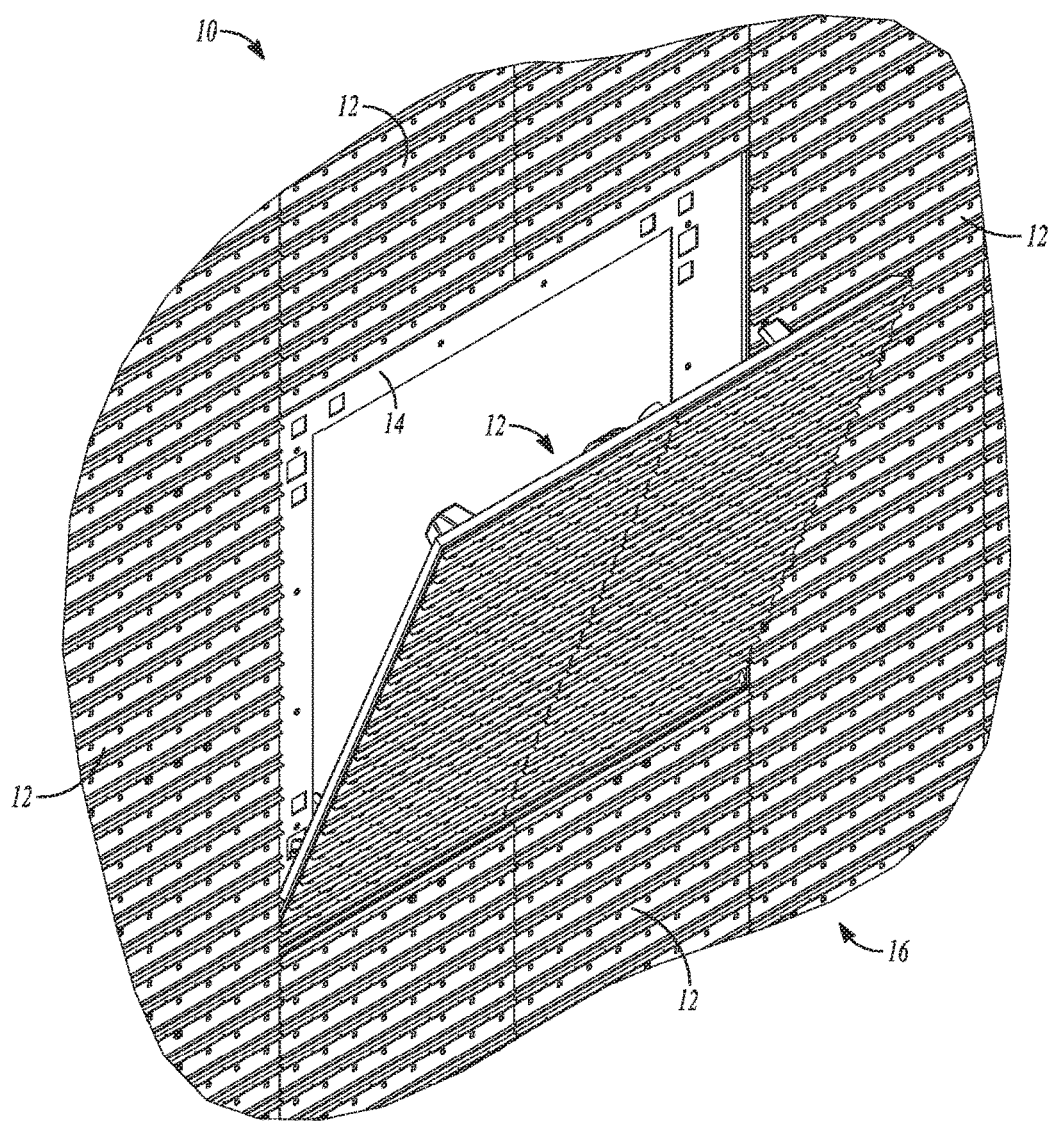
FIG. 1 is a front perspective view of an example LED display with an example LED module being installed or uninstalled from the display.
Figure 2:
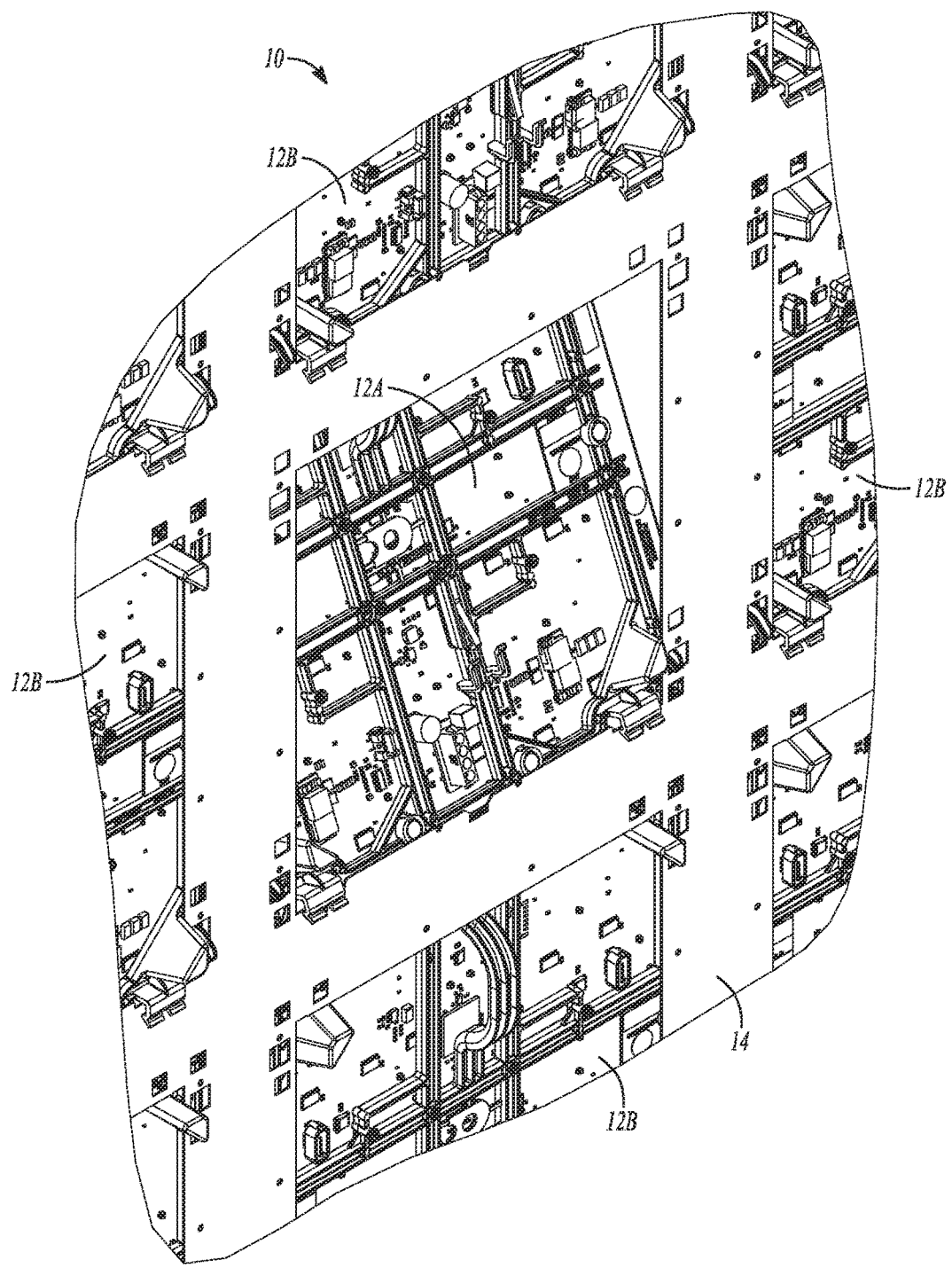
FIG. 2 is a back perspective view of an example LED display with an example LED module being installed or uninstalled from the display.

FIGS. 1 and 2 show a portion of an example LED display 10. The LED display 10 can include a plurality of individual LED modules 12 mounted to a support chassis 14. The plurality of LED modules 12 can be operated together so that the overall LED display 10 appears as a single, larger display. The LED display 10 can include a front LED display surface 16 configured to provide for a display of graphics or video content. The front LED display surface 16 can be formed from a plurality of individual light-emitting elements, such as LEDs. When multiple light-emitting elements are positioned together in close proximity, various colors can be shown by combining the colors of more than one light emitting element. In an example, the front LED display surface 16 can include an array of LED pixels that each includes a red, a green, and a blue LED. The red, green, and blue LEDs can cooperate to provide a spectrum of colors when one, two, or three of the light emitting elements in a pixel are lit at varying intensities. The front LED display surface 16 can also provide a black or empty looking surface over a portion of the display, when desired, by deactivating or turning off the LEDs in a particular portion of the LED display surface 16.

FIG. 1 shows a front perspective view of the LED display 10 with one of the LED modules 12 being in a tilted position relative to the support chassis 14, which can occur when the LED module 12 is in the process of being mounted to, or dismounted from, the support chassis 14. FIG. 2 shows a rear perspective view of the LED display 10, where a first LED module 12A is tilted relative to the support chassis 14, while adjacently-positioned second LED modules 12B are mounted to the support chassis 14. As described in more detail below, the first LED module 12A can include one or more structures that allow the first LED module 12A to be mounted to, or dismounted from, the support chassis 14 without contacting or otherwise interfering with the one or more installed, adjacently-positioned second LED modules 12B.

Figure 3:
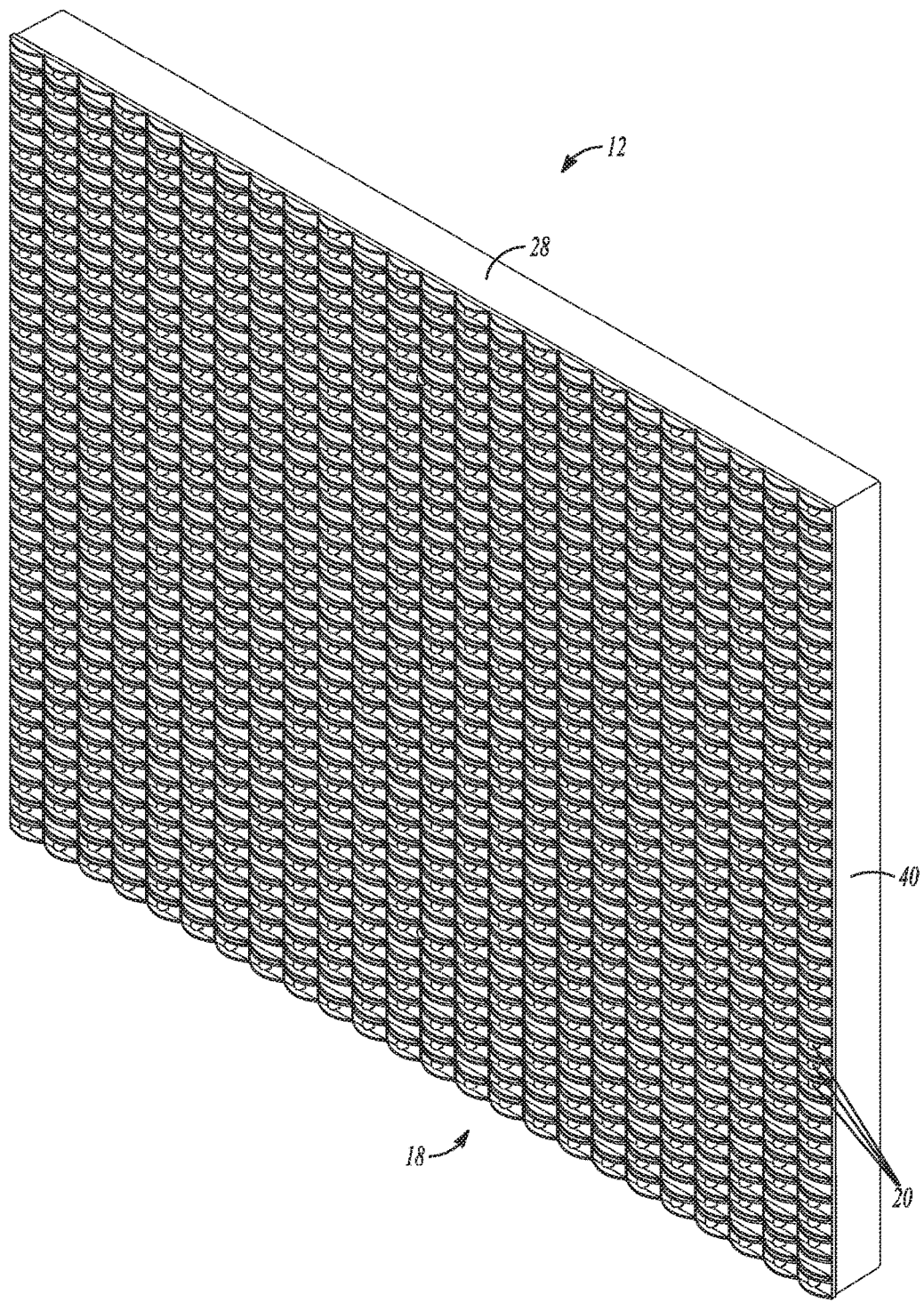
FIG. 3 is a perspective view of an example LED module.

FIG. 3 is a perspective view of a non-limiting example LED module 12, such as the first LED module 12A of FIG. 2. The LED module 12 can include a front LED display surface 18 configured to provide for a display of graphics or video content. The LED display surface 18 can include a plurality of individual light-emitting elements, such as LEDs 20. The front LED display surface 18 of the LED module 12 can be combined with front LED display surfaces 18 of one or more adjacently-positioned LED modules 12, such as the second LED modules 12B of FIG. 2, to form the front LED display surface 16 of the larger LED display 10.

Figure 4A:
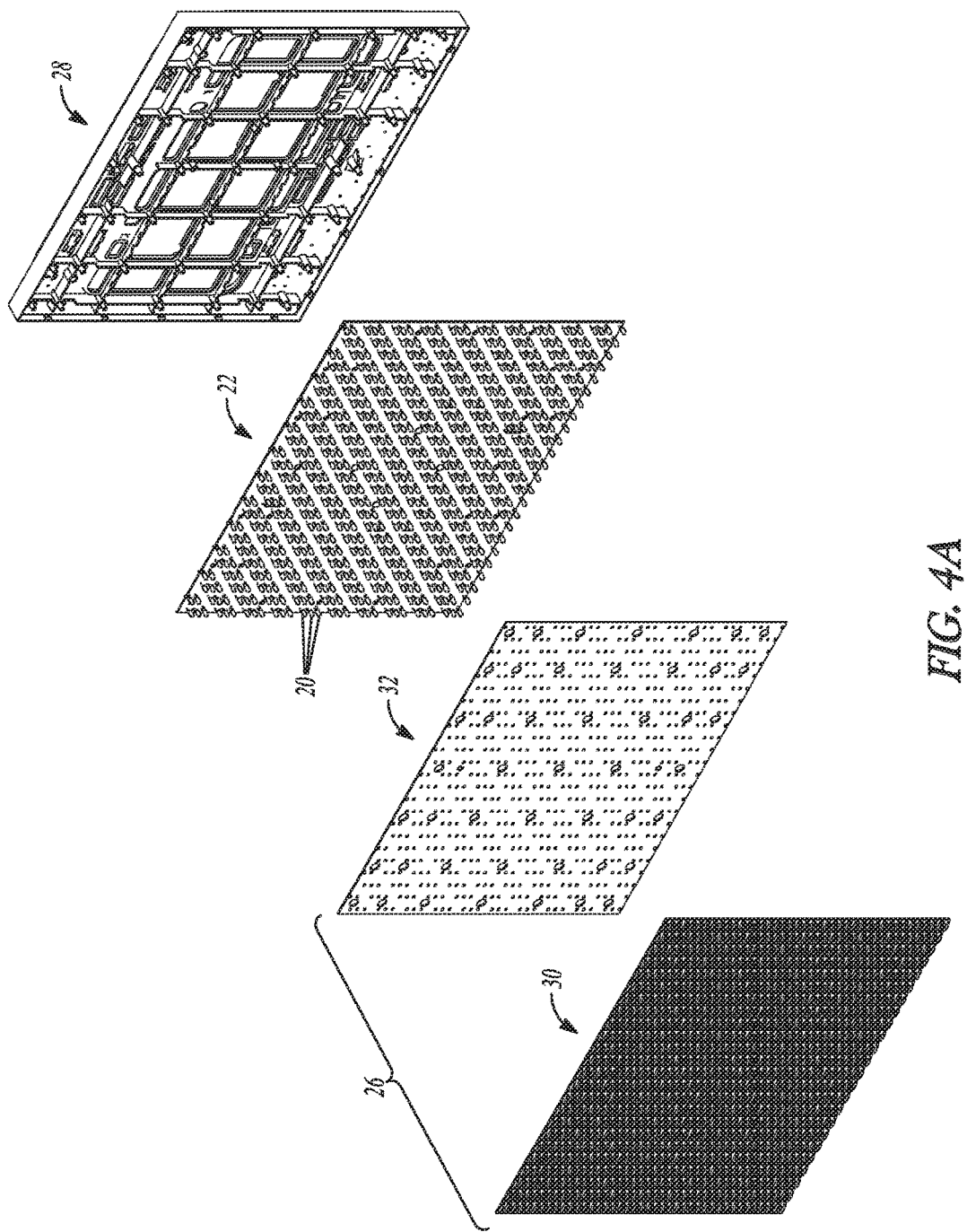
FIG. 4A is an exploded side view of an example LED display module.
Figure 4B:
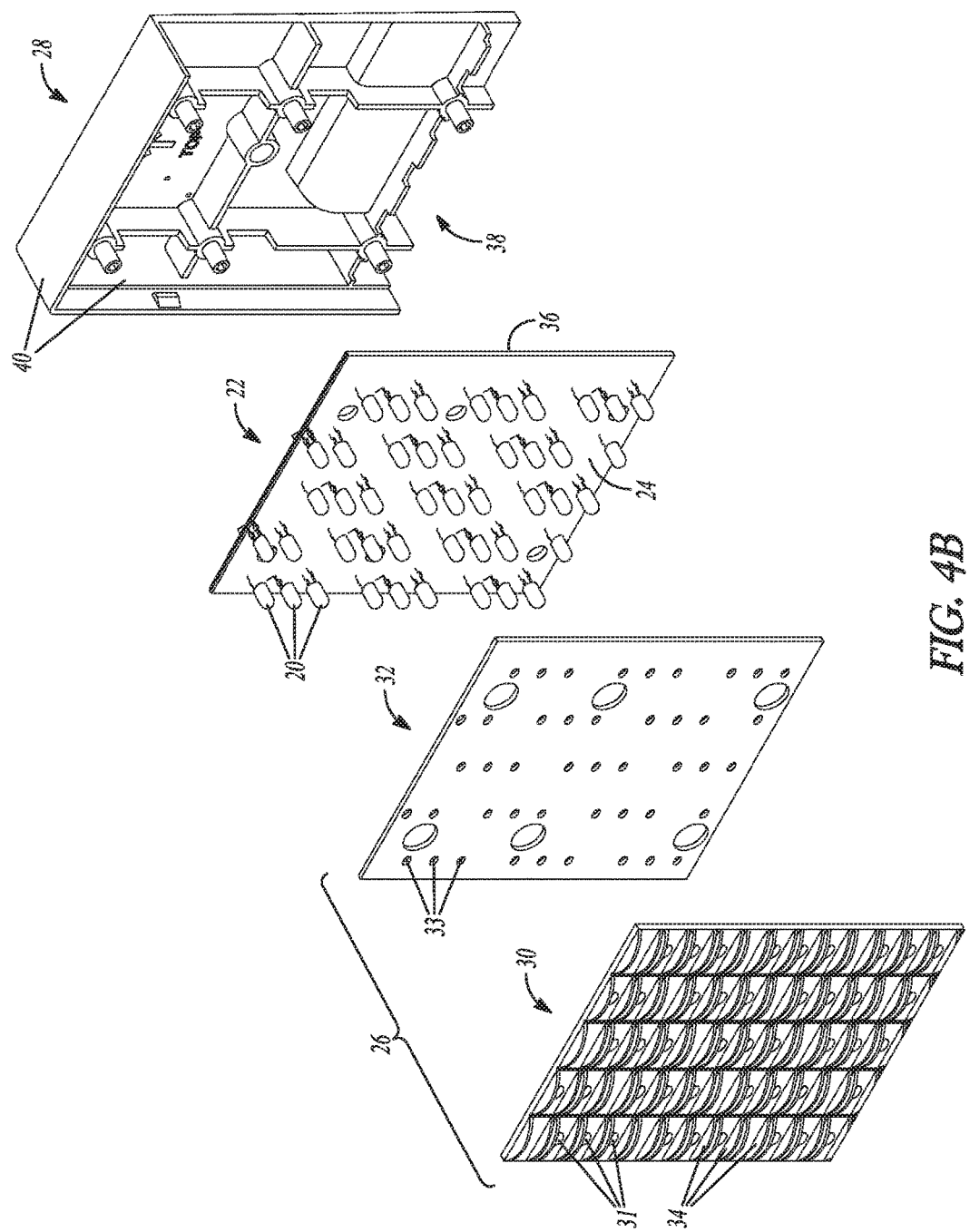
FIG. 4B is an exploded perspective view of the example LED display module of FIG. 4A.

FIGS. 4A and 4B show exploded perspective views of an example LED module 12. The LED module 12 can include a circuit board 22 and a plurality of LEDs 20. The plurality of LEDs 20 can be mounted and electrically coupled to a front face 24 of the circuit board 22. An LED mask 26 can be coupled over the top of the LEDs 20 and the front face 24 of the circuit board 22. The circuit board 22 can be coupled with a frame 28. The LED module 12 can be configured for use in an exterior environment, such as in an outdoor stadium or arena, or in an interior environment, such as an indoor stadium, arena, or venue.

FIGS. 4A and 4B show a non-limiting example of an LED mask 26. The LED mask 26 can enclose a front face of the LED module 12 and can seal an exterior environment of the LED module 12 from an interior of the LED module 12, such as the circuit board 22 and the LEDs 20. The LED mask 26 can be formed from a plurality of components, such as a substrate 30 and a pliable seal membrane 32. In an example, prior to assembly, the pliable seal membrane 32 is coupled with the substrate 30. For instance, the pliable seal membrane 36 can be over-molded onto the substrate 30, thereby making the LED mask 26 a unitary structure. The LED mask 26 can include a plurality of lumens sized and shaped to receive the plurality of LEDs 20 in a specified pattern and posture on the circuit board 22. In an example, the lumens of the LED mask 26 can include a plurality of lumens 31 through the substrate 30 and a plurality of corresponding lumens 33 through the pliable seal membrane 32. In an example, each substrate lumen 31 can be registered with a corresponding membrane lumen 33 and the resulting passageway can receive a corresponding one of the LEDs 20. The substrate 30, the pliable seal membrane 32, or both, can tightly engage around each of the LEDs 20 and can allow the LEDs 20 to project through the LED mask 26 in a sealed manner to prevent or reduce exposure of the interior of the LED module 12 to the exterior environment.

The substrate 30 can optionally include louver blades 34. The louver blades 34 can extend at least partially over or under the one or more of the LEDs 20 projecting through the LED mask 26. Each louver blade 34 can provide a measure of shade to one or more corresponding LEDs 20 and can thus assist in preventing interaction of the LED 20 with sunlight. For instance, glare, such as sunlight glare off of the LEDs 20, can interfere with projection of a true color from the LED modules 12. Accurate representation of graphic and video content can be frustrated by this interference. The shade provided by the louver blades 34 can assist in preventing glare from the LEDs 20 and additionally can allow the LEDs 20 to present a true color or a near true color from a shaded field with minimized interaction with ambient light. Further, the louver blades 34 can provide shadow in an area of the front LED display surface 18. When it is desired that a portion of the front LED display surface 18 be dark or present a black surface when video or graphic content is displayed, the shade provided by the louver blades 34 can assist so that the unlit portion of the LED display surface 18 can appear black. If glare, such as sunshine glare, is not expected to be an issue, such as when the LED module 12 is configured for use in an interior environment, then the louver blades 34 can be omitted.

An example of an LED module, including an LED mask, is disclosed in Nathan L. Nearman, U.S. patent application Ser. No. 12/859,833, entitled "LIGHT ELEMENT SEAL MODULE AND METHOD FOR SAME," filed on Aug. 20, 2010, and in Nathan L. Nearman, U.S. Provisional Patent Application Ser. No. 61/236,738, entitled "LIGHT ELEMENT SEAL MODULE AND METHOD FOR SAME," filed on Aug. 25, 2009, both of which are herein incorporated by reference in their entirety.

A rear face 36 of the circuit board 22 can be coupled with a front face 38 of the frame 28. The frame 28 can also provide for a perimeter seal around the circuit board 22 so that, in conjunction with the LED mask 26, an interior of the LED module 12 can be isolated from the exterior environment. The perimeter seal can be formed between an edge seal 40 that can extend from the front face 38 of the frame 28 and can surround the circuit board 22. The edge seal 40 can seal against at least one of an edge of the circuit board 22 or the LED mask 26, such as by sealing against the substrate 30 or the pliable seal membrane 32.

Figure 5:
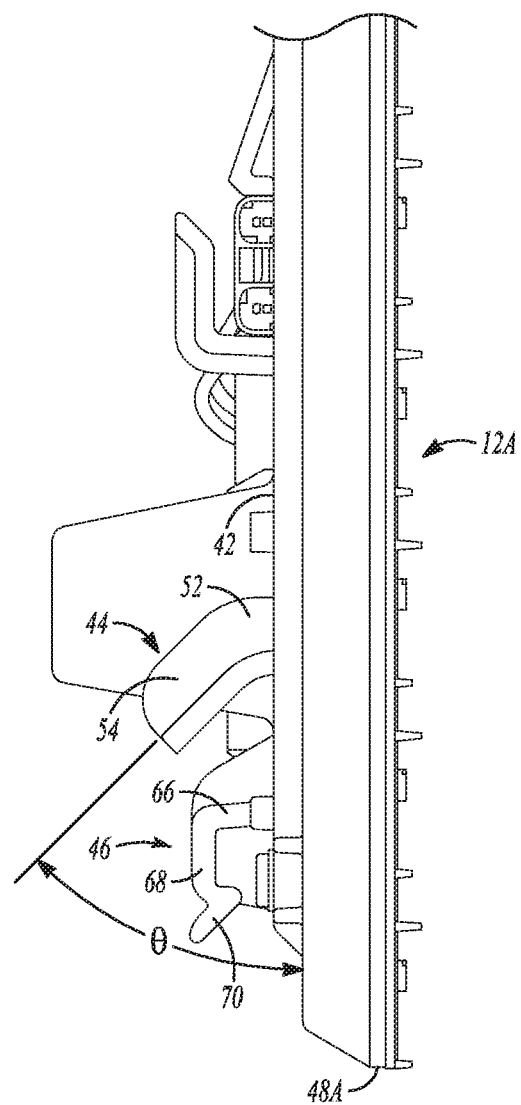
FIG. 5 is a side view of an example LED module.
Figure 6:
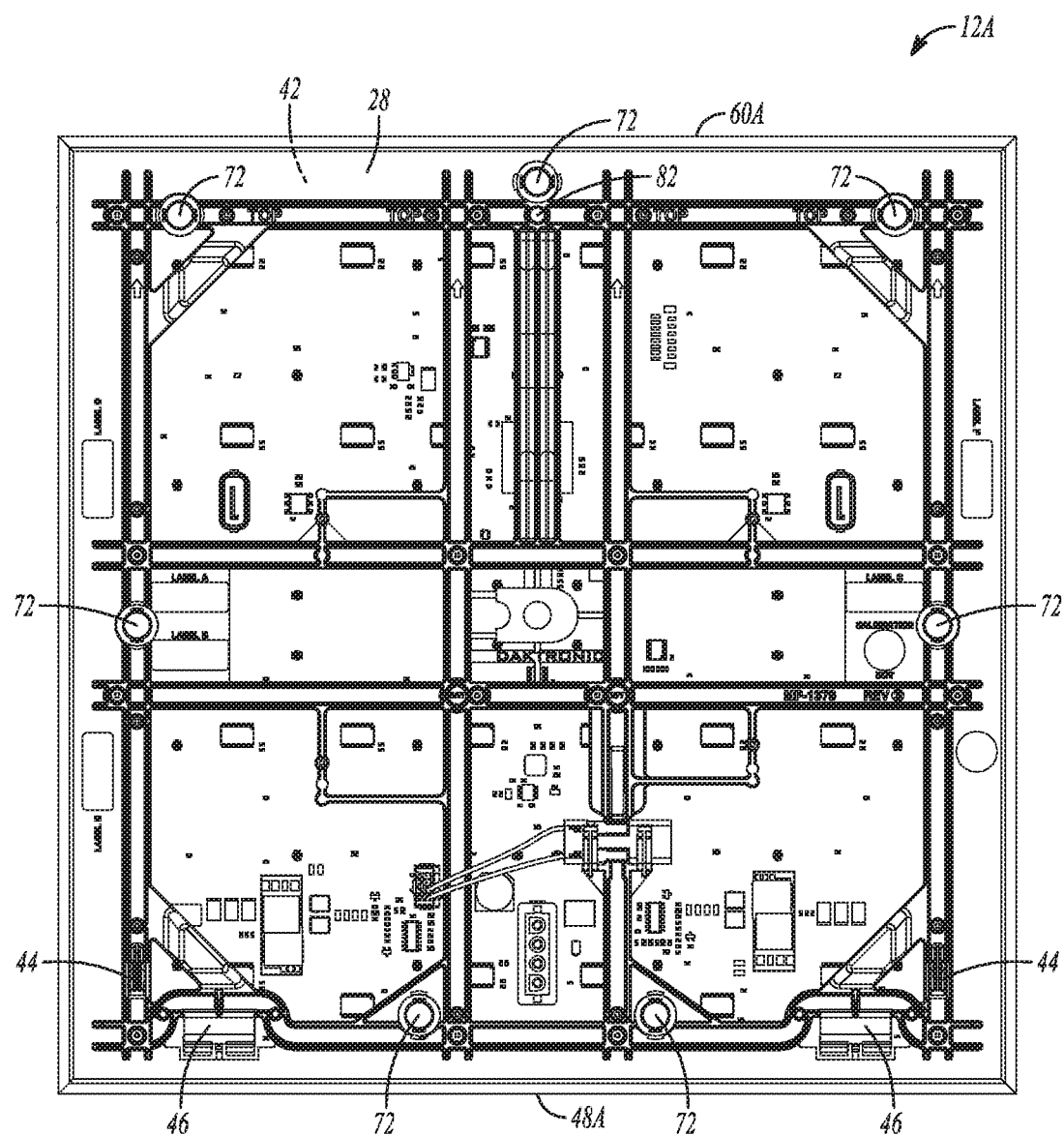
FIG. 6 is a rear view of an example LED module.

The frame 28 can provide a structure for mounting the circuit board 22 and the LED mask 26 to the support chassis 14. In an example, a rear face 42 (FIG. 5) of the frame 28 can be configured for mounting to the support chassis 14. The frame 28 can include one or more features or structures that can provide for simplified installation of the LED module 12 and avoid contacting or interfering with an adjacently-positioned LED module during installing or uninstallation of the LED module 12. FIGS. 5 and 6 show an example of an LED module 12 with these features.

FIG. 5 shows a side view of a portion of the LED module 12. The frame 28 of the LED module 12 can include one or more translating structures 44 that are configured to engage a feature of the support chassis 14 and effectuate a translation of the LED module 12. The translation of the LED module 12 can avoid contact or interference with an adjacently-positioned LED module, mounted to the support chassis 14, during a procedure for mounting the LED module 12 to the support chassis 14, or during a procedure for dismounting the LED module 12 from the support chassis 14. The frame 28 can also include one or more securing structures configured for mounting or securing the LED module 12 to the support chassis 14. In an example, the one or more securing structures can include one or more mounting hooks 46 configured for engaging a feature of the support chassis 14. In the example of FIG. 5, the one or more translating structures 44 and the one or more securing structures, such as the one or more mounting hooks 46, can be located proximate to a bottom edge 48A of the LED module 12. However, the translating structures 44, the securing structures, or both, can be located anywhere on the LED module 12 where they can provide for mounting of the LED module 12 to the support chassis 14 and for effectuating a translation of the LED module 12. In varying examples, the one or more translating structures 44 and the one or more mounting hooks 46 are located proximate the same edge of the LED module 12A, such as both being located proximate the bottom edge 48A.

Figure 8A:
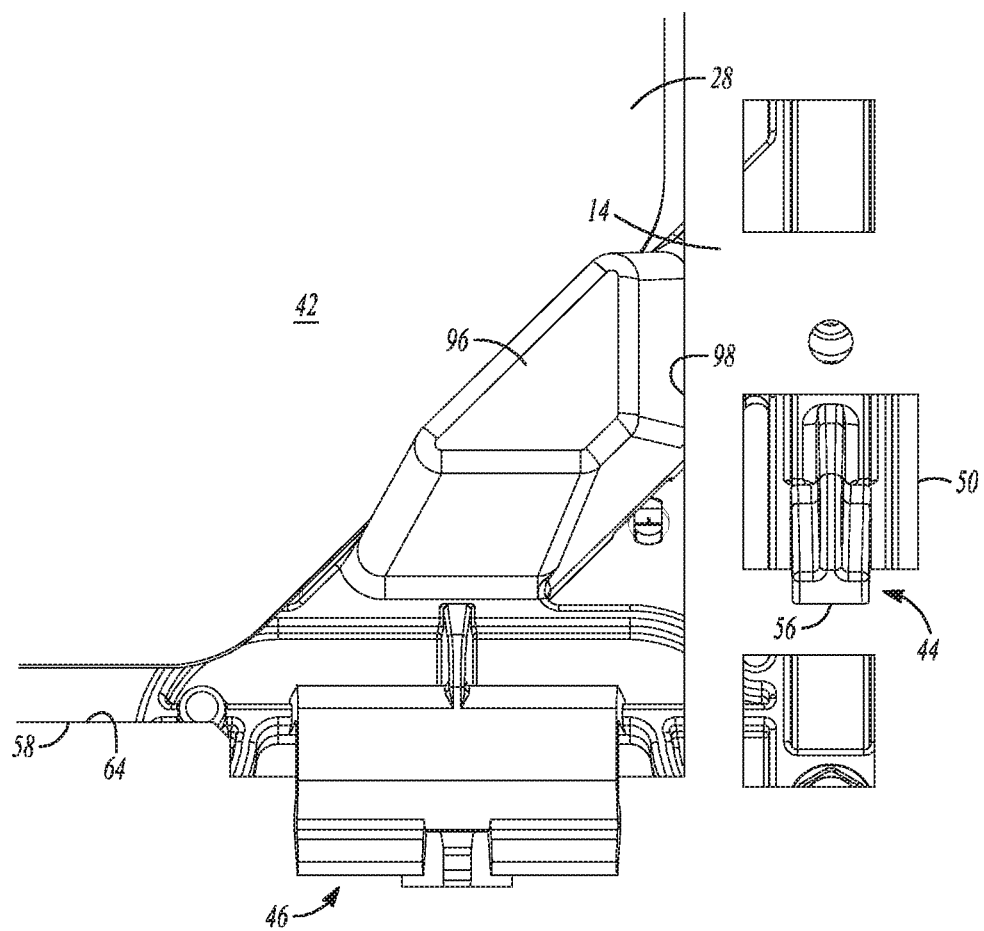
FIG. 8A is a rear view of a portion of an example LED module in a first position as the example LED module is being mounted to, or dismounted from, a support chassis.
Figure 8B:
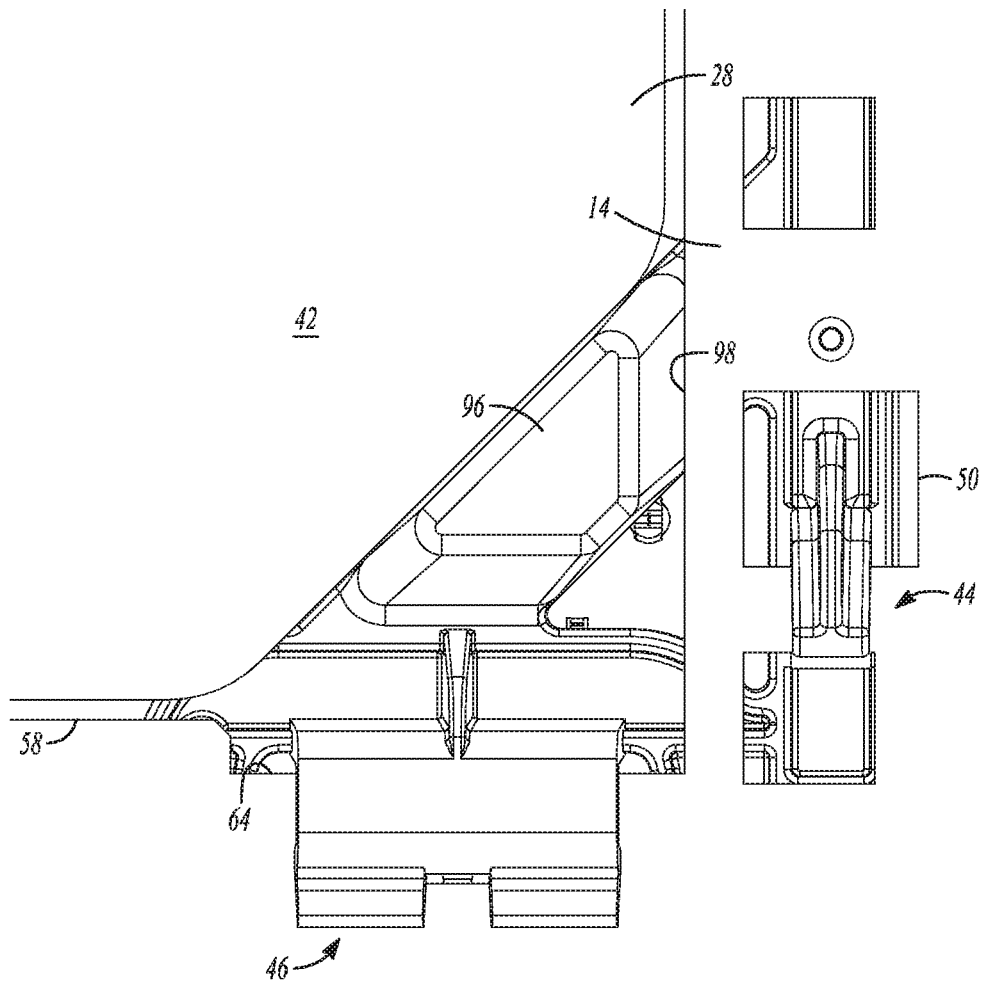
FIG. 8B is a rear view of a portion of the example LED module of FIG. 8A in a second position as the example LED module is being mounted to the support chassis.

The one or more translating structures 44 can each extend from the rear face 42 of the frame 28 and can each engage a corresponding feature of the support chassis 14, such as a corresponding opening 50 (shown in FIGS. 8A and 8B). The engagement between each translating structure 44 and the support chassis feature can provide for controlled movement of the LED module 12 as it is being mounted or dismounted. Each translating structure 44 can extend rearward and downward from the rear face 42 of the frame 28. The translating structures 44 can include one or more straight portions, one or more curved portions, or both, but the overall configuration of each translating structure 44 can be directed downward and rearward in order to effectuate a translation of the LED module 12. In an example, each translating structure 44 can extend rearward and downward with at least a portion of the translating structure 44 being at an acute angle with respect to the rear face 42. In the example shown in FIG. 5, the translating structure 44 can include a first portion 52 that extends generally rearwardly from the rear face 42 of the frame 28 and a second portion 54 that is angled rearward and downward from the first portion 52.

The second portion 54 can be oriented at an acute angle $\theta$ with respect to the rear face 42 of the frame 28. The angle $\theta$ between the second portion 54 and the rear face 42 of the frame 28 can be selected to provide for a desired translation of the LED module 12 relative to the support chassis 14, relative to an adjacently-positioned LED module, or both.

Figure 7A:
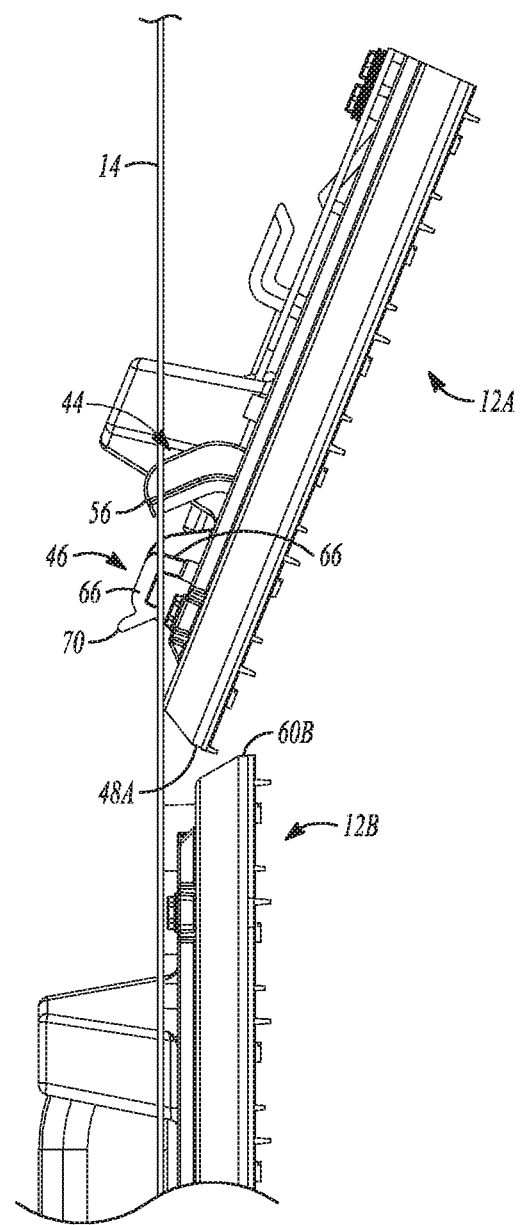
FIG. 7A is side view of an example LED module in a first position as the LED module is being mounted to, or dismounted from, a support chassis.
Figure 7B:
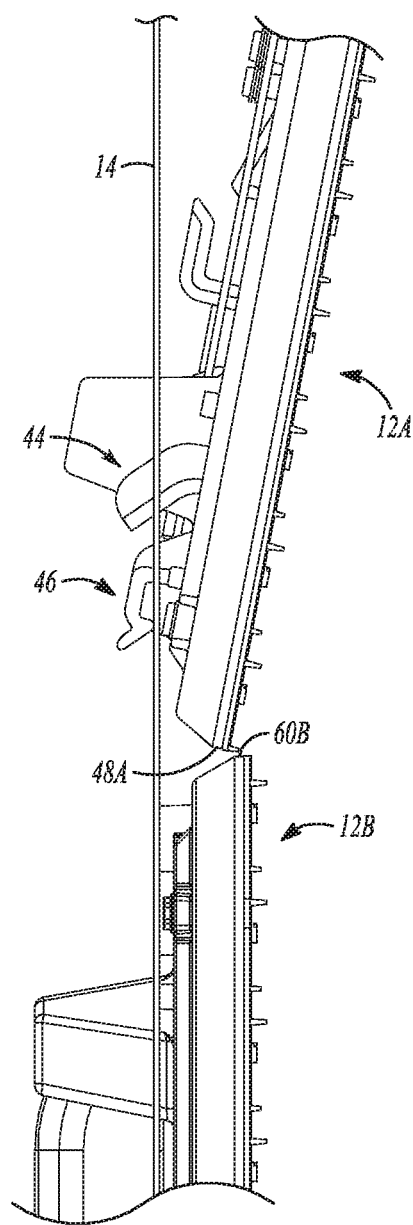
FIG. 7B is a side view of the example LED module of FIG. 7A as the LED module is being transitioned from the first position to a second position as the LED module is being mounted to the support chassis, or as the LED module is being transitioned from the second position to the first position as the LED module is being dismounted from the support chassis.
Figure 7C:
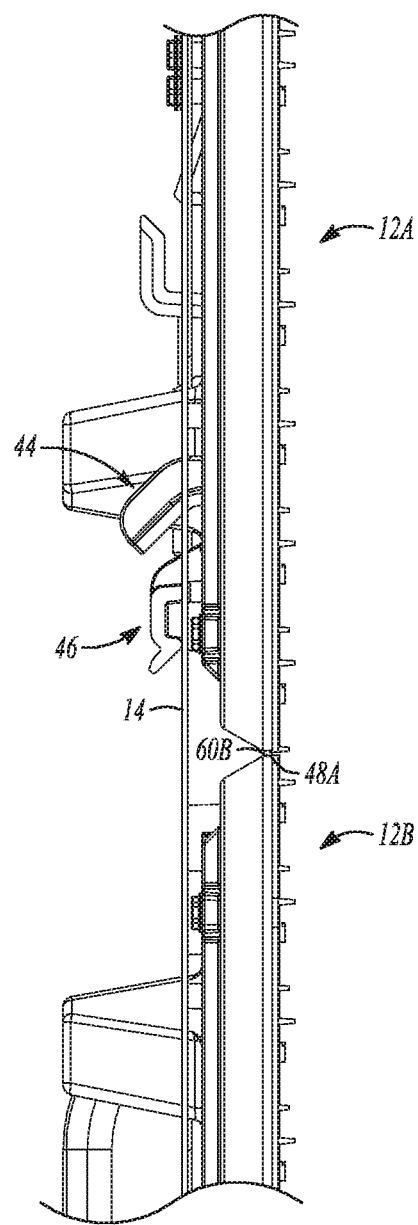
FIG. 7C is a side view of the example LED module of FIG. 7A and FIG. 7B in the second position as the LED module is being mounted to the support chassis.

FIGS. 7A-7C and FIGS. 8A and 8B show an example of the translating motion of a first LED module 12A, relative to the support chassis 14 and relative to an adjacently-positioned LED module, such as a second LED module 12B, as the first LED module 12A is being mounted to, or dismounted from, the support chassis 14. In particular, FIGS. 7A-7C show the motion of the first LED module 12A between a first position, also referred to herein as a tilted position (FIG. 7A), and a second position, also referred to herein as an aligned position (FIG. 7C), or vice versa, with FIG. 7B representing an intermediate position between the tilted position and the aligned position. In an example, in the tilted position, the first LED module 12A can be tilted relative to the support chassis 14, relative to adjacently-positioned LED modules, such as the second LED module 12B, or both. In the aligned position, the first LED module 12A can be aligned, such as by being parallel or substantially parallel to, the support chassis 14, and can be aligned with adjacently-positioned LED modules, such as by parallel or substantially parallel to the second LED module 12B. The alignment of the first LED module 12A and adjacently-positioned LED modules can provide for a substantially uniform front LED display surface 16 of an LED display 10 that appears to the viewer to be a large, continuous display surface.

In an example process of mounting the first LED module 12A onto the support chassis 14, while the first LED module 12A is in the tilted position relative to the support chassis 14, each of the one or more translating structures 44 can be engaged with a corresponding feature of the support chassis 14, such as an opening 50 (FIGS. 8A and 8B). In an example, an end 56 of each translating structure 44 can be inserted into the opening 50 (FIGS. 7A and 8A). While in the tilted position, the first LED module 12A can also be positioned so that one or more other structures or features of the first LED module 12A are aligned with corresponding features of the support chassis 14. For example, each of one or more securing structures, such as each of one or more mounting hooks 46, can be engaged with an opening within the support chassis 14, such as a mounting opening 58 in which the first LED module 12A is to be mounted. The one or more translating structures 44 can be configured to bear some or the entire load of the first LED module 12A while in the first position or the second position. The one or more mounting hooks 46 can also be configured to bear some or the entire load of the first LED module 12A while the translating structure 44 is being positioned or moved between the first position and the second position and after the first LED module 12A has been mounted to the support chassis 14. In an example, the translating structures 44 and the mounting hooks 46 can share the weight of the LED module 12A.

After positioning the translating structures 44 while in the tilted position, the first LED module 12A can be rotated or pivoted relative to the support chassis 14 to move the first LED module 12A to the aligned position by aligning the first LED module 12A relative to the support chassis 14, relative to the second LED module 12B, or both. In the example shown in FIGS. 7A-7C, a bottom edge 48A of the first LED module 12A can be rotated away from the support chassis 14 while a top edge 60A of the first LED module 12A can be rotated toward the support chassis 14. As shown in FIGS. 7B and 7C, as the bottom edge 48A rotates away from the support chassis 14, it can be rotating toward a top edge 60B of an adjacently-positioned second LED module 12B mounted to the support chassis 14 below the first LED module 12A. Similarly, the top edge 60A of the first LED module 12A can be rotating toward a bottom edge of an adjacently-positioned LED module mounted to the support chassis 14 above the first LED module 12A.

The one or more translating structures 44 can be configured so that as the first LED module 12A moves from the tilted position to the aligned position, or vice versa, the first LED module 12A is translated away from contact or interference with the adjacently-positioned second LED module 12B. In the example shown in FIGS. 7A-7C, the one or more translating structures 44 can cause the bottom edge 48A of the first LED module 12A to be translated upward, e.g., lifted, relative to the support chassis 14 as the first LED module 12A moves from the tilted position (FIG. 7A) to the aligned position (FIG. 7C) so that the bottom edge 48A does not contact the top edge 60B of the second LED module 12B. The one or more translating structures 44 can also cause a top edge of the first LED module 12A to be translated downward, e.g., dropped, relative to the support chassis 14 and an adjacent LED module as the LED module 12A moves from the tiled position to the aligned position. In an example, as the first LED module 12A is rotated relative to the support chassis 14, the angled second portion 54 of each translating structure 44 can slide along an edge 62 of the opening 50 in the support chassis 14. The angle θ between the angled second portion 54 and the rear face 42 of the frame 28 can allow the first LED module 12A to be translated as it is rotated so that the bottom edge 48A is lifted and the top edge 60A is dropped.

The acute angle θ can be selected so that the LED module 12A will be translated sufficiently to avoid contact or interference with the second LED module 12B. In an example, the smaller the angle θ, e.g., the more acute the angle θ is, the larger the upward translation of the LED module 12A will be. However, the smaller the acute angle θ, the more the translating structure 44 can tend to bind or clamp against the support chassis 14 rather than translating the LED module 12A. In an example, the acute angle θ can be selected so that the first module 12A is lifted enough that it avoids contact or interference with the second LED module 12B, but not so much that any securing structures, such as the mounting hooks 46 (described below) become disengaged from the support chassis 14. In an example, the one or more translating structures 44 and the one or more securing structures, such as the one or more mounting hooks 46, are configured so that when the first LED module 12A is in the tilted position; both the translating structures 44 and the mounting hooks 46 engage their respective features of the support chassis 14. The engagement of the translating structures 44 and the mounting hooks 46 with the respective features of the support chassis 14 can allow the LED module 12A to be repaired or otherwise maintained while still being supported by the support chassis 14.

The value of the angle θ between the angled second portion 54 of the translating structure 44 and the rear face 42 of the frame 28 can depend on other physical dimensions of the LED module 12A being mounted, the physical dimensions of adjacently-positioned LED modules, such as the second LED module 12B, and the physical dimensions of the support chassis 14. For example, the thickness of the support chassis 14 can affect the angle θ value that can be useful for the first LED module 12A. The location of the translating structure 44 relative to the adjacently-positioned LED modules, such as the distance between the translating structure 44 and the second LED module 12B, the position of the translating structure 44 with respect to the second LED module 12B, or an orientation of the translating structure 44 with respect to the second LED module 12B can also affect the angle θ value. In an example, the acute angle θ can be between about 30 degrees and about 60 degrees, inclusive, for example about 45 degrees.

The use of the translating structure 44 with the first LED module 12A can provide for easy mounting or dismounting of the first LED module 12A to the support chassis 14, without the first LED module 12A contacting or interfering with adjacently-positioned LED modules during mounting or dismounting. For example, the translating structure 44 can allow the first LED module 12A to be tilted with respect to the support chassis 14 at the beginning of installation, which can allow for easier manipulation of the first LED module 12A while moving the first LED module 12A into position for mounting. The translating structure 44 can then allow the first LED module 12A to rotate relative to the support chassis 14 and can effectuate translation of the first LED module 12A so that the first LED module 12A can be generally aligned with the support chassis 14 and adjacently-positioned LED modules, such as the second LED module 12B. The translating structure 44 can allow the first LED module 12A to be moved into the aligned position while preventing or reducing the likelihood of the first LED module 12A coming into contact or interfering with the adjacently-positioned LED module 12B. The translating structure 44 can, therefore, reduce the likelihood of damage to the LED modules 12A, 12B, and can also reduce the overall cost of manufacturing and installing an LED display 10.

The translating structures 44 can provide for the movement of the first LED module 12A relative to the adjacently-positioned LED modules with little or no special care that needs to be taken by an installer user to prevent contact between the first LED module 12A and the adjacently-positioned LED modules. For example, an installer user can mount the first LED module 12A to the support chassis 14 by positioning the translating structures 44 with respect to the openings 50, followed by rotating the first LED module 12A with respect to the support chassis 14, such as by pulling the top edge 60A of the first LED module 12A, because the translating structures 44 can prevent contact between the first LED module 12A and an adjacently-positioned second LED module 12B. Therefore, the translating structures 44 can simplify the installation or uninstallation process for installers. The interaction between each of the translating structures 44 and the corresponding feature of the support chassis 14 that it engages, such as the opening 50, can provide for this controlled motion of the first LED module 12A with respect to adjacently-positioned LED modules, such as the second LED module 12B.

The translating structures 44 can also allow for very close spacing between the first LED module 12A and adjacently-positioned LED modules, such as the second LED module 12B, while still preventing or reducing the likelihood of the first LED module 12A contacting the adjacently-positioned LED module 12B during mounting or dismounting. In an example, the translating structures 44 can allow the distance between a last line of LEDs of the first LED module 12A and the first line of LEDs of the adjacently-positioned LED module 12B to be substantially the same as a distance between adjacent lines of LEDs within the first LED module 12A or within the adjacently-positioned LED module 12B. In an example, the translating structures 44 can provide for a close spacing between the LEDs of the first LED module 12A and the LEDs of each adjacently-positioned LED module 12B of between about 0 millimeters and about 2 millimeters. The translating structures 44 can provide for this close LED spacing while also allowing for front access to an installer during mounting or dismounting of the LED module 12A. The translating structures 44 can therefore allow for an overall LED display 10 having a closer pixel pitch (e.g., the distance between adjacent LEDs 20 having the same color) that is easier to install or uninstall than an LED display formed from LED modules that do not include at least one translating structures 44. The closer pixel pitch can allow the LED display 10 to have a higher overall resolution.

Each of the one or more translating structures 44 can be configured to engage the support chassis 14 throughout or substantially throughout the process of the LED module 12 moving from the tilted position to the aligned position during mounting of the LED module 12, or from the aligned position to the tilted position during dismounting of the LED module 12. Each of the one or more translating structures 44 can be configured to be weight bearing, for example by transferring weight from the LED module 12 to the support chassis 14 via the translating structures 44. In an example, each of the one or more translating structures 44 can be capable of bearing all or substantially all of the weight of the LED module 12 so that even if other securing structures (described below) fail, the LED module 12 will not fall from the support chassis 14.

As noted above, an LED module 12 can include one or more securing structures for securing the LED module 12 to the support chassis 14. Each securing structure can be a load-bearing structure that supports at least a portion of the weight of the LED module 12 after it has been rotated into the installed or aligned position. The securing structure can also provide a clamping force to clamp the LED module 12 to the support chassis 14 or hold the LED module 12 to the support chassis 14.

As described above, in an example, the one or more securing structures can include one or more mounting hooks 46 that can each engage a feature of the support chassis 14, such as an edge 64 of a mounting opening 58 or a rear surface of the support chassis 14 (FIGS. 8A and 8B). Each of the mounting hooks 46 can have the shape of an inverted letter "J", with a shorter first portion 66 coupled to, and extending generally rearward from, the rear face 42 of the frame 28 and a longer second portion 68 coupled to, and extending generally downward from, the first portion 66. The mounting hook 46 can also include a tapered engaging portion 70 at a distal end of the mounting hook 46, such as at a distal end of the second portion 68, which can provide for tight engagement between the mounting hook 46 and the feature of the support chassis 14.

Each of the one or more mounting hooks 46 can be configured to engage the support chassis 14 and secure the LED module 12 to the support chassis 14 when the LED module 12 is in the aligned position. The mounting hook 46 can also be configured to engage the support chassis 14 throughout or substantially throughout the process of the LED module 12 moving from the tilted position to the aligned position during mounting of the LED module 12, or from the aligned position to the tilted position during dismounting of the LED module 12.

Each of the one or more mounting hooks 46 can be configured to engage or captivate the support chassis 14 while the LED module 12 is mounted to the support chassis 14. In an example, the mounting hook 46 can be resilient, such as by being made from a resilient material for example a resilient polymer. As the LED module 12 is being installed (as described above), each of the mounting hooks 46 can be deformed or deflected by the support chassis 14 so that the support chassis 14 can remain engaged or captivated by the mounting hooks 46. An example of a resilient material that can be used to form the mounting hook 46 includes, but is not limited to, a polycarbonate polymer or acrylonitrile butadiene styrene (ABS).

The at least one securing structure can also include one or more securing structures that allow for coupling between the LED module 12A and the support chassis 14. In an example, as shown in FIG. 6, the LED module 12A can include a plurality of magnets 72 that are placed at various positions within the frame 28. The magnets 72 can magnetically engage portions of the support chassis 14 including a magnetizable metal, such as magnetized steel. The magnets 72 can be distributed across the rear face 42 of the frame 28 so that a holding force between the magnets 72 and the support chassis 14 can be evenly or substantially evenly applied. In an example, the magnets 72 can be made from a magnetic material such as neodymium (e.g., an alloy of neodymium, iron, and boron, also referred to as a NdFeB magnet). In an example, the magnets 72 can include NdFeB N35H having a coercivity of about 10.8 kilooersted (kOe), an intrinsic coercivity of about 17 kOe, a magnet performance of about 35 megagauss-oersteds (MGOe), and a magnetic flux density of about 1.2 millitesla (mT). In an example, the one or more magnets 72 can produce a force of at least about 25 newton (N) (about 5.5 pounds-force ($lb_f$), such as between about 26.5 N and about 53 N, inclusive (between about 6 $lb_f$ and about 12 $lb_f$, inclusive), between the LED module 12A and the support chassis 14.

Examples of other securing structures that can be used include, but are not limited to, clamps, latches, and fasteners (e.g., screws, nails, brads, and the like). Examples of latching securing structures that can be useful for securing an LED module to a support chassis are described in the commonly-assigned patents to Robert J. Lutz et al., U.S. Pat. No. 6,816,389, entitled "LED MODULE LATCH SYSTEM," filed on Jun. 12, 2003 and issued on Nov. 9, 2004, and to Robert James Lutz et al., U.S. Pat. No. 7,055,271, entitled "ELECTRONIC DISPLAY MODULE HAVING A FOUR-POINT LATCHING SYSTEM FOR INCORPORATION INTO AN ELECTRONIC SIGN AND PROCESS," filed on Oct. 17, 2003 and issued on Jun. 6, 2006, both of which are herein incorporated by reference in their entirety.

There can be instances when it is desirable to uninstall a particular LED module 12A from the LED display 10, such as when the LED module 12A is malfunctioning and needs to be maintained, repaired, or replaced. As described above, the gap between the LED module 12A and adjacently-positioned LED modules, such as a third LED module 12C mounted to the support chassis 14 above the first LED module 12A, can be very small, such as less than about 1 millimeter, for example less than about 0.5 millimeters. Small gaps can make dismounting the first LED module 12A from the support chassis 14 difficult because there is little space to provide for gripping or grasping the LED module 12A. In an example, the one or more fastenings structures, such as the magnets 72 or latches, can be actuable from a front side 74 of the LED module 12A, even if the securing structures are located on a back side 76 of the LED module 12A, such as on or proximate the rear face 42 of the frame 28.

Figure 9A:
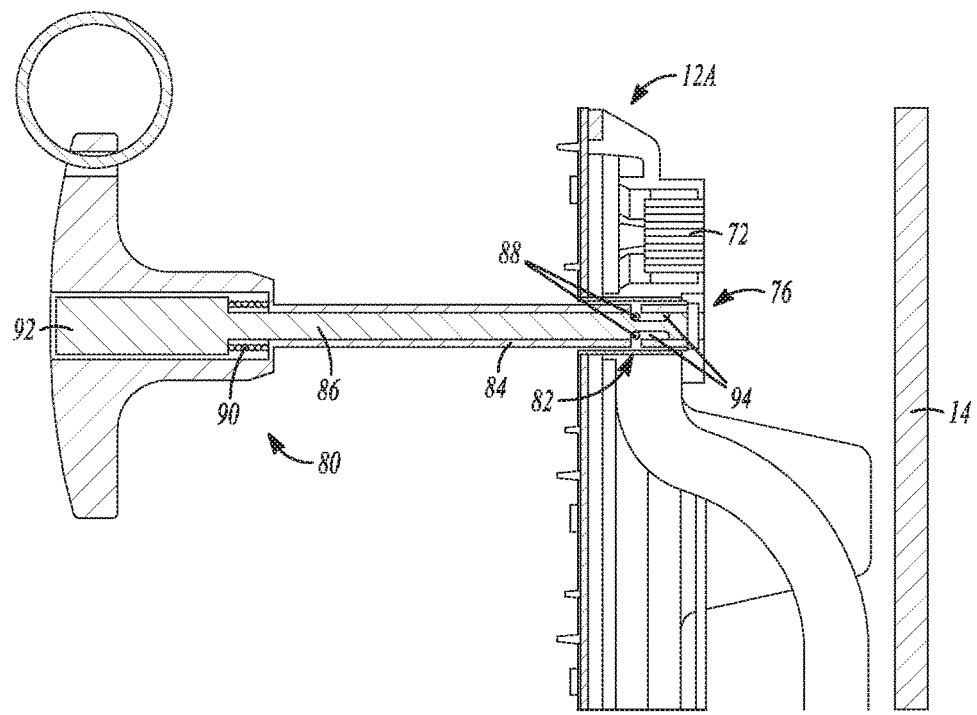
FIGS. 9A and 9B show views of an example LED engaging tool being used to disengage one or more securing structures of an example LED module.
Figure 9B:
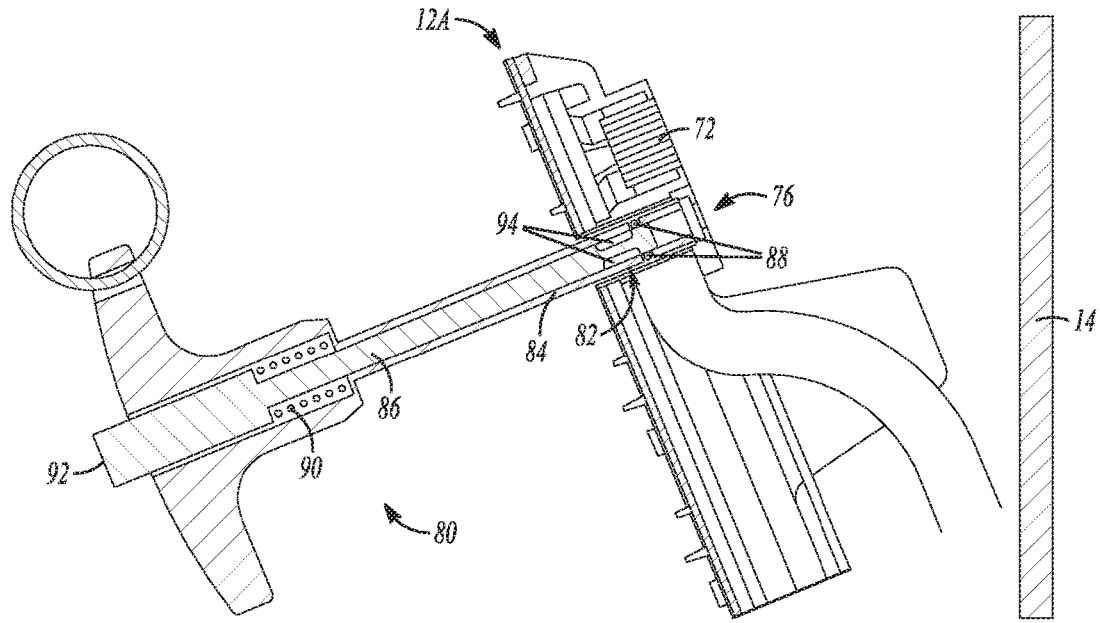

As shown in FIGS. 9A and 9B, the LED module 12A can include a lumen structure to receive a module engaging tool 80. FIGS. 9A and 9B further show a non-limiting example of the module engaging tool 80. The module engaging tool 80 can provide for actuation or disengagement of the one or more securing structures, such as the magnets 72. The LED module 12A can, for example, include a passageway 82 extending from the front side 74 of the LED module 12A to or near to the back side 76. The passageway 82 can be formed though one or more of the LED mask 26, the circuit board 22, and the frame 28, such as via a series of aligned openings. The module engaging tool 80 can be configured to engage the passageway 82. The module engaging tool 80 can also be configured to engage other portions of the LED module 12A, such as a lower edge 48A or an upper edge 60A.

In an example, a portion of the module engaging tool 80 can be inserted through the passageway 82 so that the module engaging tool 80 can engage the LED module 12A, such as by engaging the back side 76 or by engaging one or more structures within the passageway 82. In an example, the module engaging tool 80 can include a shaft 84 that can accommodate a piston 86. The piston 86 can be actuated by a user between a first position (FIG. 9A) and a second position (FIG. 9B). The piston 86 can be configured to engage and actuate one or more engaging structures, such as one or more bearings 88, between a retracted position, or installing position (FIG. 9A), and an expanded position, or engaging position (FIG. 9B). In an example, the piston 86 can be biased into the second position, such as with a spring 90, so that the piston 86 urges the hearing 88 into the expanded position. The piston 86 can be actuated by a user, such as by pushing a portion 92 of the piston 86 that extends out of the shaft 84, which can appear as a button 92 to the user. The actuation of the piston 86 to the first position can allow the one or more bearings 88 to settle into one or more grooves 94 so that the shaft 84 of the tool 80 can have a small enough cross-sectional profile to fit within the passageway 82. After the shaft 84 has been inserted into the passageway 82, the button 92 of the piston 86 can be released so that the spring 90 can bias the piston 86 to the second position, which can force the bearings 88 out of the grooves 94 and against an inner surface of the passageway 82 to lock the tool 80 in position relative to the LED module 12A. The passageway 82 can also include features, such as grooves, that can facilitate engagement with the bearings 88. The example engagement tool 80 shown in FIGS. 9A and 9B can be referred to as a ball lock pin. An example of a ball lock pin that can be used as the module engaging tool 80 is the ball lock pin sold by CarLane Manufacturing Co., St. Louis, Mo., USA, having part number CL-3-BLPT-1.50.

When the bearings 88 are engaging the passageway 82, a user-initiated force can be exerted on the LED module 12 via the tool 80, thereby providing for disengagement of the securing structures, such as by overcoming the magnetic force between one or more of the magnets 72 and the support chassis 14. In the example where the one or more translating structures 44 and the mounting hooks 46 are located proximate a bottom edge 48A of the LED module 12A, the passageway 82 can be located proximate the upper edge 60A so that less force is required by the installer user to pivot the LED module 12A and to disengage the securing structures.

Returning to FIGS. 8A and 8B, an LED module, such as the first LED module 12A, can include one or more positioning structures 96 that can assist an installer user to properly place the LED module 12A in a position relative to the support chassis 14. For example, as shown in FIG. 8A, the positioning structure 96 can be positioned on the rear face 42 of the frame 28 adjacent to, and in contact with, an edge 98 of the mounting opening 58 when the LED module 12A is in a desired position relative to the support chassis 14, e.g., such that each translating structure 44 is engaged with, or in position to engage, the opening 50 and so that the mounting hook 46 is engaged with, or in position to engage, the edge 64 of the mounting opening 58. A positioning structure 96 can be included on the LED module 12A to correspond to, and engage with, other features of the support chassis 14, such as openings, pegs, or pins.

In an example, one or more of the translating structures 44, the mounting hooks 46, and the positioning structures 96 can be formed as an integral part of the frame 28, such as by being integral with the rear face 42 of the frame 28. The translating structures 44, the mounting hooks 46, and the positioning structures 96 can be formed as integral with the frame 28 by molding the frame 28 in a shape that includes these features, such as by molding the frame 28 from a polymer to include one or more of the translating structures 44, the mounting hooks 46, and the positioning structures 96. The ability to integrate the translating members 44, the mounting hooks 46, or the positioning structures 96 with an LED module frame 28 can simplify the installation process in a cost effective manner by reducing the number of parts that need to be manufactured, kept track of, and used during installation. Examples of materials that the frame 28, including the translating structures 44, the mounting hooks 46, and the positioning structures 96, can be molded from are polymeric materials including moldable polymers, thermoformable polymers, or thermoplastic polymers, such as at least one of, but not limited to, a polycarbonate, and acrylonitrile butadiene styrene (ABS), or non-polymeric materials, such as steel, aluminum, and magnesium.

Figure 10:
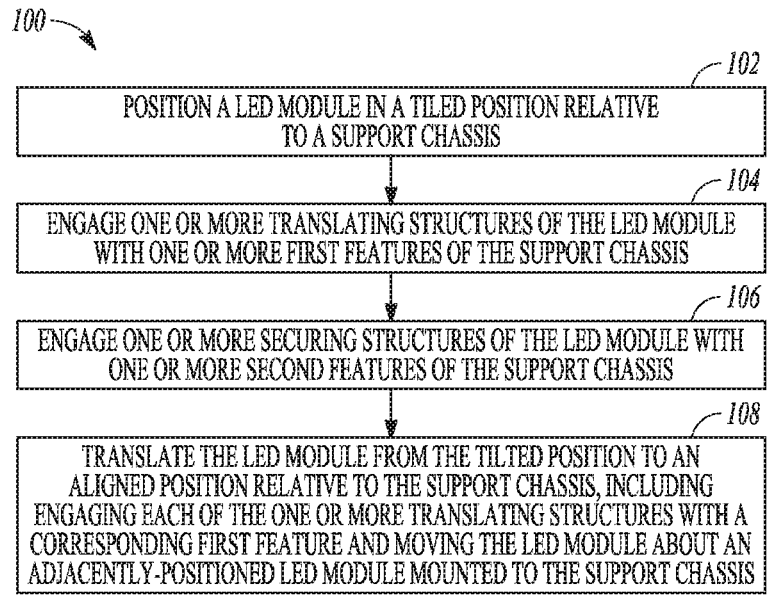
FIG. 10 illustrates an example method of mounting an example LED module to a support chassis.

FIG. 10 illustrates an example method 100 of installation, such as a method of mounting an LED module to a support chassis. The method 100 can include, at 102, positioning the LED module in a tilted position relative to the support chassis. At 104, one or more translating structures of the LED module can be engaged with one or more first features of the support chassis, such as one or more first openings within the support chassis, when the LED module is in the tilted position. At 106, one or more securing structures, such as one or more mounting hooks, can be engaged with one or more second features of the support chassis, such as one or more second openings within the support chassis. Engaging the one or more securing structures with the one or more second features can include at least partially supporting a weight of the LED module.

At 108, the LED module can be translated from the tilted position to an aligned position relative to the support chassis. During translation of the LED module, the one or more translating structures can engage the one or more first features, which can effectuate a translation of the LED module to avoid contact or interference with an adjacently-positioned LED module mounted to the support chassis. The translating of the LED module can move the LED module about the adjacently-positioned LED module to avoid contact or interference. As the LED module is translating from the tilted position to the aligned position, an angled portion of each of the one or more translating structures can slide along a corresponding first feature of the support chassis so that the LED module can be lifted and translated away from the adjacent LED module.

Figure 11:
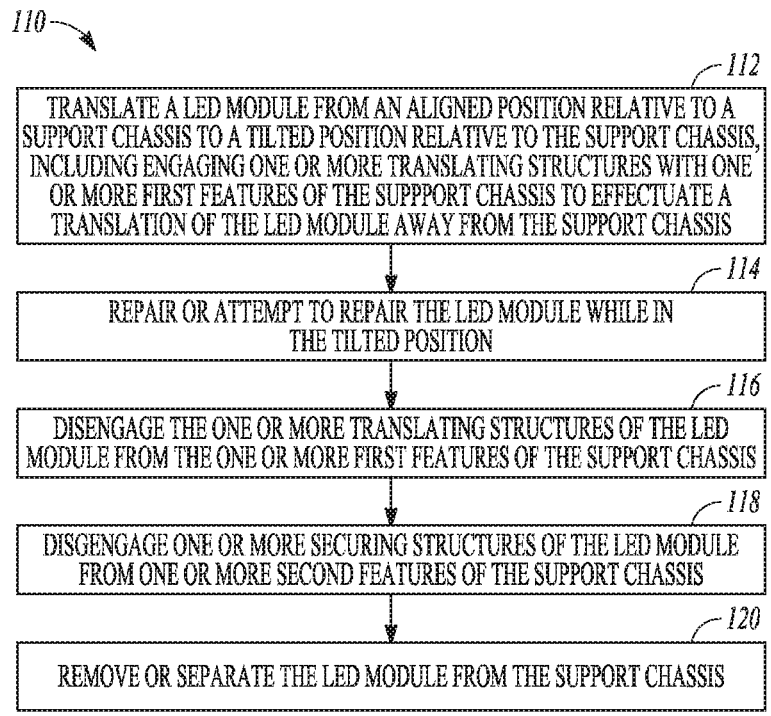
FIG. 11 illustrates an example method of dismounting an example LED module from a support chassis.

FIG. 11 illustrates an example method 110 of uninstalling, such as a method of dismounting an LED module from a support chassis. The method 110 can include, at 112, translating the LED module from an aligned position relative to the support chassis to a tilted position relative to the support chassis. During the translation of the LED module, the one or more translation structures can engage one or more first features of the support chassis, which can effectuate a translation of the LED module to avoid contact or interference with an adjacently-positioned LED module mounted to the support chassis. The translating of the LED module can move the LED module about the adjacently-positioned LED module to avoid contact or interference.

After translating the LED module from the aligned position to the tilted position, the method 110 can include one or more optional steps. At 114, the LED module can be repaired, or attempted to be repaired, while in the tilted position. Alternatively, or in addition to repair, at 116, the one or more translating structures of the LED module can be disengaged from the one or more first features of the support chassis. Prior to uninstalling, the LED module can be secured to the support chassis with one or more securing structures, such as one or more mounting hooks, configured to at least partially support the weight of the LED module. Alternatively, rather than or in addition to attempting to repair the LED module, the method 110 can include, at 118, disengaging the one or more securing structures from the one or more second structures. At 120, the LED module can be removed or separated from the support chassis.

To better illustrate the present LED displays, modules, and methods, a non-limiting list of Examples is provided here:

Example 1 can include subject matter (such as an apparatus, a device, a method, or one or more means for performing acts), such as can include a frame for an LED module. The subject matter can comprise a first face configured for coupling with an LED circuit board, a second face configured for mounting to a support chassis, and one or more translating structures coupled to the second face, each translating structure configured to engage a feature of the support chassis effectuating a translation of the LED module to avoid contact or interference with an adjacently-positioned LED module, mounted to the support chassis, during a mounting or a dismounting procedure.

Example 2 can include, or can optionally be combined with the subject matter of Example 1, to optionally include one or more securing structures configured for mounting or securing the frame to the support chassis.

Example 3 can include, or can optionally be combined with the subject matter of one or any combination of Examples 1 and 2, to optionally include the one or more securing structures include one or more mounting hooks coupled to the second face, each of the one or more mounting hooks including a first portion extending rearward from the second face and a second portion coupled to, and extending downward from, the first portion.

Example 4 can include, or can optionally be combined with the subject matter of one or any combination of Examples 1-3, to optionally include the one or more mounting hooks are positioned proximate a bottom edge of the second face.

Example 5 can include, or can optionally be combined with the subject matter of one or any combination of Examples 1-4, to optionally include the one or more mounting hooks are integral with the second face.

Example 6 can include, or can optionally be combined with the subject matter of one or any combination of Examples 1-5, to optionally include the one or more mounting hooks include a tapered engaging portion at a distal end of each of the one or more mounting hooks.

Example 7 can include, or can optionally be combined with the subject matter of one or any combination of Examples 1-6, to optionally include the one or more securing structures are configured to at least partially support a weight of the LED module.

Example 8 can include, or can optionally be combined with the subject matter of one or any combination of Examples 1-7, to optionally include the one or more securing structures includes at least one of a plurality of magnets or a latch.

Example 9 can include, or can optionally be combined with the subject matter of one or any combination of Examples 1-8, to optionally include the one or more securing structures are actuable from a front side of the LED module, the front side of the LED module oriented in a direction of the first face of the frame.

Example 10 can include, or can optionally be combined with the subject matter of one or any combination of Examples 1-9, to optionally include the one or more securing structures are configured to engage one or more second features of the support chassis.

Example 11 can include, or can optionally be combined with the subject matter of one or any combination of Examples 1-10, to optionally include the one or more second features include an opening in the support chassis.

Example 12 can include, or can optionally be combined with the subject matter of one or any combination of Examples 1-11, to optionally include the one or more translating structures are configured to at least partially support a weight of the LED module.

Example 13 can include, or can optionally be combined with the subject matter of one or any combination of Examples 1-12, to optionally include the one or more translating structures are integral with the second face.

Example 14 can include, or can optionally be combined with the subject matter of one or any combination of Examples 1-13, to optionally include each of the one or more translating structures extend rearward and downward from the second face.

Example 15 can include, or can optionally be combined with the subject matter of one or any combination of Examples 1-14, to optionally include each of the one or more translating structures extend rearward and downward at an acute angle from the second face.

Example 16 can include, or can optionally be combined with the subject matter of one or any combination of Examples 1-15, to optionally include the acute angle is between 30 degrees and 60 degrees, inclusive.

Example 17 can include, or can optionally be combined with the subject matter of one or any combination of Examples 1-16, to optionally include each of the one or more translating structures include a first portion extending generally rearward from the second face and a second portion extending rearward and downward from the first portion, wherein the second portion forms the acute angle with respect to the second face.

Example 18 can include, or can optionally be combined with the subject matter of one or any combination of Examples 1-17, to optionally include the feature of the support chassis is an opening within the support chassis.

Example 19 can include, or can optionally be combined with the subject matter of one or any combination of Examples 1-18, to optionally include the one or more translating structures are configured to effectuate a translation of the LED module, including lifting the LED module relative to the adjacently-positioned LED module or relative to the support chassis.

Example 20 can include, or can optionally be combined with the subject matter of one or any combination of Examples 1-19, to optionally include the one or more translating structures are configured to effectuate a translation of the LED module, including pivoting the LED module relative to the adjacently-positioned LED module or relative to the support chassis.

Example 21 can include, or can optionally be combined with the subject matter of one or any combination of Examples 1-20, to optionally include the one or more translating structures are configured to maintain a spacing between a last line of LEDs of the LED module and a first line of LEDs of the adjacently-positioned LED module to be substantially the same as a distance between adjacent lines of LEDs within the LED module or between adjacent lines of LEDS within the adjacently-positioned LED module.

Example 22 can include, or can optionally be combined with the subject matter of one or any combination of Examples 1-21, to optionally include one or more positioning structures configured to position or align the LED module relative to the support chassis.

Example 23 can include, or can optionally be combined with the subject matter of one or any combination of Examples 1-22, to optionally include the one or more positioning structures are integral with the second face.

Example 24 can include, or can optionally be combined with the subject matter of one or any combination of Examples 1-23, to include subject matter (such as an apparatus, a device, a method, or one or more means for performing acts), such as can include a frame for an LED module. The subject matter can comprise a first face configured for coupling with an LED circuit board, a second face configured for mounting to a support chassis, and one or more securing structures coupled to the second face, the one or more securing structures being configured to mount or secure the frame to the support chassis, wherein the one or more securing structures are integral with the second face.

Example 25 can include, or can optionally be combined with the subject matter of one or any combination of Examples 1-24, to optionally include one or more translating structures coupled to the second face, each translating structure configured to engage a feature of the support chassis effectuating a translation of the LED module to avoid contact or interference with an adjacently-positioned LED module, mounted to the support chassis, during a mounting or a dismounting procedure.

Example 26 can include, or can optionally be combined with the subject matter of one or any combination of Examples 1-25, to optionally include the one or more translating structures are configured to at least partially support a weight of the LED module.

Example 27 can include, or can optionally be combined with the subject matter of one or any combination of Examples 1-26, to optionally include the one or more translating structures are integral with the second face.

Example 28 can include, or can optionally be combined with the subject matter of one or any combination of Examples 1-27, to optionally include each of the one or more translating structures extend rearward and downward from the second face.

Example 29 can include, or can optionally be combined with the subject matter of one or any combination of Examples 1-28, to optionally include the feature of the support chassis is an opening within the support chassis.

Example 30 can include, or can optionally be combined with the subject matter of one or any combination of Examples 1-29, to optionally include the one or more translating structures are configured to effectuate a translation of the LED module, including lifting the LED module relative to the adjacently-positioned LED module or relative to the support chassis.

Example 31 can include, or can optionally be combined with the subject matter of one or any combination of Examples 1-30, to optionally include the one or more translating structures are configured to effectuate a translation of the LED module, including pivoting the LED module relative to the adjacently-positioned LED module or relative to the support chassis.

Example 32 can include, or can optionally be combined with the subject matter of one or any combination of Examples 1-31, to optionally include the one or more securing structures are configured to engage the support chassis through the translation of the LED module by the one or more translating structures.

Example 33 can include, or can optionally be combined with the subject matter of one or any combination of Examples 1-32, to optionally include the one or more translating structures and the one or more securing structures are configured to maintain a spacing between a last line of LEDs of the LED module and a first line of LEDs of the adjacently-positioned LED module to be substantially the same as a distance between adjacent lines of LEDs within the LED module or between adjacent lines of LEDS within the adjacently-positioned LED module.

Example 34 can include, or can optionally be combined with the subject matter of one or any combination of Examples 1-33, to optionally include the one or more securing structures are positioned proximate a bottom edge of the second face.

Example 35 can include, or can optionally be combined with the subject matter of one or any combination of Examples 1-34, to optionally include the one or more securing structures include one or more mounting hooks coupled to the second face, each of the one or more mounting hooks including a first portion extending rearward from the second face and a second portion coupled to, and extending downward from, the first portion.

Example 36 can include, or can optionally be combined with the subject matter of one or any combination of Examples 1-35, to optionally include the one or more mounting hooks include a tapered engaging portion at a distal end of each of the one or more mounting hooks.

Example 37 can include, or can optionally be combined with the subject matter of one or any combination of Examples 1-36, to optionally include the one or more securing structures are configured to at least partially support a weight of the LED module.

Example 38 can include, or can optionally be combined with the subject matter of one or any combination of Examples 1-37, to optionally include one or more second securing structures includes at least one of a plurality of magnets or a latch.

Example 39 can include, or can optionally be combined with the subject matter of one or any combination of Examples 1-38, to optionally include the one or more second securing structures are actuable from a front side of the LED module, the front side of the LED module oriented in a direction of the first face of the frame.

Example 40 can include, or can optionally be combined with the subject matter of one or any combination of Examples 1-39, to optionally include the one or more securing structures are configured to engage one or more features of the support chassis.

Example 41 can include, or can optionally be combined with the subject matter of one or any combination of Examples 1-40, to optionally include the one or more features include an opening in the support chassis.

Example 42 can include, or can optionally be combined with the subject matter of one or any combination of Examples 1-41, to optionally include one or more positioning structures configured to position or align the LED module relative to the support chassis.

Example 43 can include, or can optionally be combined with the subject matter of one or any combination of Examples 1-42, to optionally include the one or more positioning structures are integral with the second face.

Example 44 can include, or can optionally be combined with the subject matter of one or any combination of Examples 1-43, to include subject matter (such as an apparatus, a device, a method, or one or more means for performing acts), such as can include an LED module. The subject matter can comprise a circuit board including a plurality of LEDs, and a frame having a first face coupled with the circuit board and a second face including one or more translating structures, configured to engage one or more features of the support chassis effectuating a translation of the LED module to avoid contact with an adjacently-positioned LED module, mounted to the support chassis, when installing or uninstalling the LED module.

Example 45 can include, or can optionally be combined with the subject matter of one or any combination of Examples 1-44, to optionally include the second face of the frame includes one or more securing structures, configured for mounting or securing the frame to a support chassis.

Example 46 can include, or can optionally be combined with the subject matter of one or any combination of Examples 1-45, to optionally include the one or more securing structures include one or more mounting hooks coupled to the second face, each of the one or more mounting hooks including a first portion extending rearward from the second face and a second portion coupled to, and extending downward from, the first portion.

Example 47 can include, or can optionally be combined with the subject matter of one or any combination of Examples 1-46, to optionally include the one or more mounting hooks are positioned proximate a bottom edge of the frame.

Example 48 can include, or can optionally be combined with the subject matter of one or any combination of Examples 1-47, to optionally include the one or more mounting hooks include a tapered engaging portion at a distal end of each of the one or more mounting hooks.

Example 49 can include, or can optionally be combined with the subject matter of one or any combination of Examples 1-48, to optionally include the one or more securing structures are integral with the frame.

Example 50 can include, or can optionally be combined with the subject matter of one or any combination of Examples 1-49, to optionally include the one or more securing structures are configured to at least partially support a weight of the LED module.

Example 51 can include, or can optionally be combined with the subject matter of one or any combination of Examples 1-50, to optionally include the at least one securing structure includes at least one of a plurality of magnets or a latch.

Example 52 can include, or can optionally be combined with the subject matter of one or any combination of Examples 1-51, to optionally include the one or more securing structures are actuable from a front side of the LED module, the front side of the LED module oriented in a direction of the first face of the frame.

Example 53 can include, or can optionally be combined with the subject matter of one or any combination of Examples 1-52, to optionally include the one or more securing structures are actuable with an engaging tool configured to engage the LED module Example 54 can include, or can optionally be combined with the subject matter of one or any combination of Examples 1-53, to optionally include the engaging tool is configured to be received through a passageway from the front side of the LED module.

Example 55 can include, or can optionally be combined with the subject matter of one or any combination of Examples 1-54, to optionally include the engaging tool includes a shaft housing one or more bearings actuable between a retracted position and an expanded position, wherein the shaft is configured to be received through the passageway when the one or more bearings are in the retracted position, and the one or more bearings are configured to engage the LED module when in the extended position.

Example 56 can include, or can optionally be combined with the subject matter of one or any combination of Examples 1-55, to optionally include the one or more securing structures are configured to engage one or more second features of the support chassis.

Example 57 can include, or can optionally be combined with the subject matter of one or any combination of Examples 1-56, to optionally include the one or more second features include an opening in the support chassis.

Example 58 can include, or can optionally be combined with the subject matter of one or any combination of Examples 1-57, to optionally include the one or more translating structures are integral with the frame.

Example 59 can include, or can optionally be combined with the subject matter of one or any combination of Examples 1-58, to optionally include the one or more translating structures are configured to at least partially support a weight of the LED module.

Example 60 can include, or can optionally be combined with the subject matter of one or any combination of Examples 1-59, to optionally include each of the one or more translating structures extend rearward and downward from the second face of the frame.

Example 61 can include, or can optionally be combined with the subject matter of one or any combination of Examples 1-60, to optionally include each of the one or more translating structures extend rearward and downward at an acute angle from the second face.

Example 62 can include, or can optionally be combined with the subject matter of one or any combination of Examples 1-61, to optionally include the acute angle is between 30 degrees and 60 degrees, inclusive.

Example 63 can include, or can optionally be combined with the subject matter of one or any combination of Examples 1-62, to optionally include each of the one or more translating structures include a first portion extending generally rearward from the second face and a second portion extending rearward and downward from the first portion, wherein the second portion forms the acute angle with respect to the second face.

Example 64 can include, or can optionally be combined with the subject matter of one or any combination of Examples 1-63, to optionally include the feature of the support chassis is an opening within the support chassis.

Example 65 can include, or can optionally be combined with the subject matter of one or any combination of Examples 1-64, to optionally include the one or more translating structures are configured to effectuate a translation of the LED module, including lifting the LED module relative to the adjacently-positioned LED module or relative to the support chassis.

Example 66 can include, or can optionally be combined with the subject matter of one or any combination of Examples 1-65, to optionally include the one or more translating structures are configured to effectuate a translation of the LED module, including pivoting the LED module relative to the adjacently-positioned LED module or relative to the support chassis.

Example 67 can include, or can optionally be combined with the subject matter of one or any combination of Examples 1-66, to optionally include the one or more translating structures are configured to maintain a spacing between a last line of LEDs of the LED module and a first line of LEDs of the adjacently-positioned LED module to be substantially the same as a distance between adjacent lines of LEDs within the LED module or between adjacent lines of LEDS within the adjacently-positioned LED module.

Example 68 can include, or can optionally be combined with the subject matter of one or any combination of Examples 1-67, to optionally include the frame further includes one or more positioning structures configured to position or align the LED module relative to the support chassis.

Example 69 can include, or can optionally be combined with the subject matter of one or any combination of Examples 1-68, to optionally include the one or more positioning structures are integral with the frame.

Example 70 can include, or can optionally be combined with the subject matter of one or any combination of Examples 1-69, to optionally include the one or more translating structures are configured to engage the one or more features of the support chassis effectuating a translation of the LED module from a first position to a second position, wherein, during movement from the first position to the second position, an angled portion of each of the one or more translating structures slides along a bottom edge of a corresponding feature of the support chassis, causing the LED module to be lifted and translated away from the adjacently-positioned LED module.

Example 71 can include, or can optionally be combined with the subject matter of one or any combination of Examples 1-70, to include subject matter (such as an apparatus, a device, a method, or one or more means for performing acts), such as can include an LED module. The subject matter can comprise a circuit board including a plurality of LEDs, and a frame having a first face coupled with the circuit board and a second face including one or more securing structures integral with the frame, wherein the one or more securing structures are configured for mounting or securing the frame to a support chassis.

Example 72 can include, or can optionally be combined with the subject matter of one or any combination of Examples 1-71, further comprising one or more translating structures coupled to the second face, each translating structure configured to engage a feature of the support chassis effectuating a translation of the LED module to avoid contact or interference with an adjacently-positioned LED module, mounted to the support chassis, during a mounting or a dismounting procedure.

Example 73 can include, or can optionally be combined with the subject matter of one or any combination of Examples 1-72, to optionally include the one or more translating structures are configured to at least partially support a weight of the LED module.

Example 74 can include, or can optionally be combined with the subject matter of one or any combination of Examples 1-73, to optionally include the one or more translating structures are integral with the second face.

Example 75 can include, or can optionally be combined with the subject matter of one or any combination of Examples 1-74, to optionally include each of the one or more translating structures extend rearward and downward from the second face.

Example 76 can include, or can optionally be combined with the subject matter of one or any combination of Examples 1-75, to optionally include the feature of the support chassis is an opening within the support chassis.

Example 77 can include, or can optionally be combined with the subject matter of one or any combination of Examples 1-76, to optionally include the one or more translating structures are configured to effectuate a translation of the LED module, including lifting the LED module relative to the adjacently-positioned LED module or relative to the support chassis.

Example 78 can include, or can optionally be combined with the subject matter of one or any combination of Examples 1-77, to optionally include the one or more translating structures are configured to effectuate a translation of the LED module, including pivoting the LED module relative to the adjacently-positioned LED module or relative to the support chassis.

Example 79 can include, or can optionally be combined with the subject matter of one or any combination of Examples 1-78, to optionally include the one or more securing structures are configured to engage the support chassis through the translation of the LED module by the one or more translating structures.

Example 80 can include, or can optionally be combined with the subject matter of one or any combination of Examples 1-79, to optionally include the one or more translating structures and the one or more securing structures are configured to maintain a spacing between a last line of LEDs of the LED module and a first line of LEDs of the adjacently-positioned LED module to be substantially the same as a distance between adjacent lines of LEDs within the LED module or between adjacent lines of LEDS within the adjacently-positioned LED module.

Example 81 can include, or can optionally be combined with the subject matter of one or any combination of Examples 1-80, to optionally include the one or more securing structures are positioned proximate a bottom edge of the second face.

Example 82 can include, or can optionally be combined with the subject matter of one or any combination of Examples 1-81, to optionally include the one or more securing structures include one or more mounting hooks coupled to the second face, each of the one or more mounting hooks including a first portion extending rearward from the second face and a second portion coupled to, and extending downward from, the first portion.

Example 83 can include, or can optionally be combined with the subject matter of one or any combination of Examples 1-82, to optionally include the one or more mounting hooks include a tapered engaging portion at a distal end of each of the one or more mounting hooks.

Example 84 can include, or can optionally be combined with the subject matter of one or any combination of Examples 1-83, to optionally include the one or more securing structures are configured to at least partially support a weight of the LED module.

Example 85 can include, or can optionally be combined with the subject matter of one or any combination of Examples 1-84, to optionally include one or more second securing structures includes at least one of a plurality of magnets or a latch.

Example 86 can include, or can optionally be combined with the subject matter of one or any combination of Examples 1-85, to optionally include the one or more second securing structures are actuable from a front side of the LED module, the front side of the LED module oriented in a direction of the first face of the frame.

Example 87 can include, or can optionally be combined with the subject matter of one or any combination of Examples 1-86, to optionally include the one or more securing structures are actuable with an engaging tool configured to engage the LED module Example 88 can include, or can optionally be combined with the subject matter of one or any combination of Examples 1-87, to optionally include the engaging tool is configured to be received through a passageway from the front side of the LED module.

Example 89 can include, or can optionally be combined with the subject matter of one or any combination of Examples 1-88, to optionally include the engaging tool includes a shaft housing one or more bearings actuable between a retracted position and an expanded position, wherein the shaft is configured to be received through the passageway when the one or more bearings are in the retracted position, and the one or more bearings are configured to engage the LED module when in the extended position.

Example 90 can include, or can optionally be combined with the subject matter of one or any combination of Examples 1-89, to optionally include the one or more securing structures are configured to engage one or more features of the support chassis.

Example 91 can include, or can optionally be combined with the subject matter of one or any combination of Examples 1-90, to optionally include the one or more features include an opening in the support chassis.

Example 92 can include, or can optionally be combined with the subject matter of one or any combination of Examples 1-91, to optionally include one or more positioning structures configured to position or align the LED module relative to the support chassis.

Example 93 can include, or can optionally be combined with the subject matter of one or any combination of Examples 1-92, to optionally include the one or more positioning structures are integral with the second face.

Example 94 can include, or can optionally be combined with the subject matter of one or any combination of Examples 1-93, to optionally include an LED mask including a plurality of lumens sized and shaped to receive the plurality of LEDs.

Example 94 can include, or can optionally be combined with the subject matter of one or any combination of Examples 1-94, to include subject matter (such as an apparatus, a device, a method, or one or more means for performing acts), such as can include an LED module. The subject matter can comprise a circuit board having a first face and a rear face opposed to the first face, a plurality of LEDs coupled to the circuit board first face, and a frame including a first face, positioned adjacent to the circuit board, and a second face, opposed to the frame first face, including one or more mounting hooks and one or more translating structures. Each of the one or more mounting hooks can be positioned proximate a bottom edge of the frame and can include a first portion extending rearward from the second face and a second portion coupled to, and extending downward from, the first portion. Each of the one or more translating structures can extend rearward and downward from the second face of the frame at an acute angle and is configured to engage a first opening in a support chassis. Each of the one or more translating structures can be configured to translate the LED panel assembly between a first position relative to the support chassis, in which the first portion of each of the one or more mounting hooks engages an inner edge of a second opening in the support chassis, and a second position relative to the support chassis, in which the second portion of each of the one or more mounting hooks engages a rear surface of the support chassis.

Example 95 can include, or can optionally be combined with the subject matter of one or any combination of Examples 1-94, to include subject matter (such as an apparatus, a device, a method, or one or more means for performing acts), such as can include an LED display system. The subject matter can comprise a support chassis including a plurality of first openings and a plurality of second openings therethrough, each first opening configured to receive a substantial portion of an LED module, each second opening being positioned proximate a corresponding first opening, and a plurality of LED modules, each configured for mounting within or engaging a corresponding one of the first and second openings. Each LED module can include a circuit board having a first face and a rear face opposed to the first face, a plurality of LEDs coupled to the circuit board first face, and a frame including a first face, positioned adjacent to the circuit board, and a second face, opposed to the frame first face, including one or more mounting hooks and one or more translating structures. The one or more mounting hooks can be positioned proximate a bottom edge of the frame and each can include a first portion extending rearward from the second face and a second portion coupled to, and extending downward from, the first portion. Each of the one or more translating structures can extend rearward and downward at an acute angle relative to the second face and can be configured to engage a corresponding first opening in a support chassis. The one or more translating structures can be configured to translate the LED panel assembly between a first position relative to the support chassis, in which the first portion of the mounting hook engages an inner edge of a second opening in the support chassis, and a second position relative to the support chassis, in which the second portion of the mounting hook engages a rear surface of the support chassis.

Example 96 can include, or can optionally be combined with the subject matter of one or any combination of Examples 1-95, to optionally include the one or more mounting hooks being integral with the frame.

Example 97 can include, or can optionally be combined with the subject matter of one or any combination of Examples 1-96, to optionally include the one or more mounting hooks including a tapered engaging portion at a distal end of each of the one or more mounting hooks.

Example 98 can include, or can optionally be combined with the subject matter of one or any combination of Examples 1-97, to optionally include the one or more mounting hooks being configured to at least partially support a weight of the LED module.

Example 99 can include, or can optionally be combined with the subject matter of one or any combination of Examples 1-98, to optionally include the one or more translating structures being integral with the frame.

Example 100 can include, or can optionally be combined with the subject matter of one or any combination of Examples 1-99, to optionally include the acute angle of the translating structures relative to the rear face of the frame being between 30 degrees and 60 degrees, inclusive.

Example 101 can include, or can optionally be combined with the subject matter of one or any combination of Examples 1-100, to optionally include each of the one or more translating structures including a first portion extending generally rearward from the second face and a second portion extending rearward and downward from the first portion, wherein the second portion forms the acute angle with respect to the second face.

Example 102 can include, or can optionally be combined with the subject matter of one or any combination of Examples 1-101, to optionally include one or more securing structures including at least one of a plurality of magnets or a latch.

Example 103 can include, or can optionally be combined with the subject matter of one or any combination of Examples 1-102, to optionally include the one or more securing structures being actuable from a front side of the LED module, the front side of the LED module oriented in a direction of the first face of the frame.

Example 104 can include, or can optionally be combined with the subject matter of one or any combination of Examples 1-103, to optionally include an engaging tool for actuating or disengaging the one or more securing structures. The engaging tool can be configured to be received through a passageway from the front side of the LED module.

Example 105 can include, or can optionally be combined with the subject matter of one or any combination of Examples 1-104, to optionally include the engaging tool including a shaft housing one or more bearings actuable between a retracted position and an expanded position, wherein the shaft is configured to be received through the passageway when the one or more bearings are in the retracted position, and the one or more bearings are configured to engage the LED module when in the extended position.

Example 106 can include, or can optionally be combined with the subject matter of one or any combination of Examples 1-105, to optionally include the one or more translating structures being configured to effectuate a translation of the LED module, including lifting the LED module relative to the adjacently-positioned LED module.

Example 107 can include, or can optionally be combined with the subject matter of one or any combination of Examples 1-106, to optionally include the one or more translating structures being configured to effectuate a translation of the LED module, including pivoting the LED module relative to the support chassis.

Example 108 can include, or can optionally be combined with the subject matter of one or any combination of Examples 1-107, to optionally include the one or more translating structures being configured to effectuate a translation of the LED module, including pivoting the LED module relative to the adjacently-positioned LED module.

Example 109 can include, or can optionally be combined with the subject matter of one or any combination of Examples 1-108, to optionally include the one or more translating structures being configured to maintain a spacing of between 0 millimeters and 2 millimeters, inclusive, between the LED module and the adjacently-spaced LED module when the LED module and the adjacently-spaced LED module are mounted to the support chassis.

Example 110 can include, or can optionally be combined with the subject matter of one or any combination of Examples 1-109, to optionally include the frame further including one or more positioning structures configured to position or align the LED module relative to the support chassis.

Example 111 can include, or can optionally be combined with the subject matter of one or any combination of Examples 1-110, to optionally include the one or more positioning structures being integral with the frame.

Example 112 can include, or can optionally be combined with the subject matter of one or any combination of Examples 1-111, to optionally include the one or more translating structures being configured to engage the one or more first openings of the support chassis effectuating a translation of the LED module from a first position to a second position, wherein, during movement from the first position to the second position, an angled portion of each of the one or more translating structures slides along a bottom edge of a corresponding first opening, causing the LED module to be lifted and translated away from the adjacently-positioned LED module.

Example 113 can include, or can optionally be combined with the subject matter of one or any combination of Examples 1-112, to include subject matter (such as an apparatus, a device, a method, or one or more means for performing acts), such as can include a method of installation. The subject matter can comprise positioning an LED module in a tilted position relative to a support chassis, engaging a translating structure of the LED module, when the LED module is in the titled position, with a first feature of the support chassis, engaging a securing structure of the LED module, when the LED module is in the titled position, with a second feature of the support chassis, and translating the LED module from the tilted position to an aligned position, relative to the support chassis, including engaging the translating structure and the first feature and moving the LED module about an adjacently-positioned LED module mounted to the support chassis.

Example 114 can include, or can optionally be combined with the subject matter of one or any combination of Examples 1-113, to optionally include the moving the LED module about the adjacently-positioned LED module including avoiding contact or interference with the adjacently-positioned LED module.

Example 68 can include, or can optionally be combined with the subject matter of one or any combination of Examples 1-67, to optionally include the engaging the securing structure of the LED module with the second feature of the support chassis including at least partially supporting a weight of the LED module.

Example 115 can include, or can optionally be combined with the subject matter of one or any combination of Examples 1-114, to include subject matter (such as an apparatus, a device, a method, or one or more means for performing acts), such as can include a method of uninstalling. The subject matter can comprise translating an LED module from an aligned position relative to a support chassis to a tilted position relative to the support chassis, including engaging a translating structure of the LED module and a first feature of the support chassis to effectuate a translation of the LED module away from an adjacently-positioned LED module mounted to the support chassis, and one or more of: (a) repairing the LED module while in the tilted position; (b) disengaging the translating structure from the first feature of the support chassis; and (c) disengaging a securing structure from a second feature of the support chassis, including removing the LED module from the support chassis.

Example 116 can include, or can optionally be combined with the subject matter of one or any combination of Examples 1-115, to optionally include the repairing the LED module in the tilted position including supporting a weight of at least a portion of the LED module using an engagement of the securing structure and the second feature of the support chassis.

Example 117 can include, or can optionally be combined with the subject matter of one or any combination of Examples 1-116, to optionally include the disengaging the translating structure from the first feature including disengaging the translating structure from a first opening in the support chassis.

Example 118 can include, or can optionally be combined with the subject matter of one or any combination of Examples 1-117, to optionally include the disengaging the securing structure from the second feature including disengaging a mounting hook an edge of the second feature.

Example 119 can include, or can optionally be combined with the subject matter of one or any combination of Examples 1-118, to optionally include the disengaging the securing structure from the second feature including disengaging a magnet or a latch structure relative to the support chassis.

The above Detailed Description is intended to be illustrative, and not restrictive. For example, the above-described examples (or one or more elements thereof) can be used in combination with each other. Other embodiments can be used, such as by one of ordinary skill in the art upon reviewing the above description. Also, various features or elements can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented, at least in part. Some examples can include a computer-readable medium or machine-readable medium encoded with instructions operable to configure an electronic device to perform methods or method steps as described in the above examples. An implementation of such methods or method steps can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

What is claimed is:

1. A display module, comprising:
   a circuit board including a plurality of light-emitting elements;
   a frame having a first face coupled with the circuit board and a second face;
   one or more securing structures coupled to the frame, the one or more securing structures being actuable between an engaged configuration and a disengaged configuration, wherein the one or more securing structures mount or secure the display module to a support structure to at least partially support a weight of the display module when the one or more securing structures are in the engaged configuration and wherein the display module is not secured to the support structure by the one or more securing structures when the one or more securing structures are in the disengaged configuration;
   wherein the one or more securing structures comprise one or more magnets, wherein the one or more magnets magnetically engage the support structure with sufficient holding force to at least partially support the weight of the display module when the one or more magnets are in the engaged configuration, and wherein the one or more magnets are magnetically disengaged from the support structure when the one or more magnets are in the disengaged configuration and
   one or more mounting hooks, wherein each of the one or more mounting hooks includes a first portion coupled to and extending generally rearward from the second face and a second portion coupled to and extending generally downward from the first hook portion such that the one or more mounting hooks at least partially support the weight of the display module when the one or more securing structures are in the disengaged configuration.

2. The display module of claim 1, wherein each of the one or more mounting hooks are positioned proximate a bottom edge of the second face.

3. A display module, comprising:
   a circuit board including a plurality of light-emitting elements;
   a frame having a first face coupled with the circuit board and a second face;
   one or more securing structures coupled to the frame, the one or more securing structures being actuable between an engaged configuration and a disengaged configuration, wherein the one or more securing structures mount or secure the display module to a support structure to at least partially support a weight of the display module when the one or more securing structures are in the engaged configuration and wherein the display module is not secured to the support structure by the one or more securing structures when the one or more securing structures are in the disengaged configuration, wherein the one or more securing structures are actuable between the engaged and disengaged configurations from a front side of the display module, the front side of the display module oriented in a direction of the first face of the frame, and one or more mounting hooks, wherein each of the one or more mounting hooks includes a first portion coupled to and extending generally rearward from the second face and a second portion coupled to and extending generally downward from the first hook portion such that the one or more mounting hooks at least partially support the weight of the display module when the one or more securing structures are in the disengaged configuration.

4. The display module of claim 3, wherein the one or more securing structures includes at least one of: one or more magnets, or a latch.

5. The display module of claim 1, wherein the one or more securing structures are configured to engage one or more features of the support structure.

6. The display module of claim 1, wherein the one or more mounting hooks are each configured to engage an opening in the support structure.

7. The display module of claim 1, further comprising one or more translating structures coupled to the second face, each translating structure configured to engage a feature of the support structure to effectuate a translation of the display module to avoid contact or interference with an adjacently-positioned display module also mounted to the support structure, during a mounting or a dismounting procedure.

8. The display module of claim 7, wherein the one or more mounting hooks at least partially support the display module when the one or more translating structures effectuate the translation of the display module.

9. The display module of claim 1, wherein each of the one or more mounting hooks are integrally coupled to the frame.

10. A display module, comprising:
a circuit board including a plurality of light-emitting elements;
a frame having a first face coupled with the circuit board and a second face;
one or more securing structures coupled to the frame, the one or more securing structures being actuable between an engaged configuration and a disengaged configuration, wherein the one or more securing structures mount or secure the display module to a support structure to at least partially support a weight of the display module when the one or more securing structures are in the engaged configuration and wherein the display module is not secured to the support structure by the one or more securing structures when the one or more securing structures are in the disengaged configuration;

one or more mounting hooks, wherein each of the one or more mounting hooks includes a first portion coupled to and extending generally rearward from the second face and a second portion coupled to and extending generally downward from the first hook portion such that the one or more mounting hooks at least partially support the weight of the display module when the one or more securing structures are in the disengaged configuration; and one or more positioning structures to assist in positioning of the display module relative to the support structure during installation of the display module.

11. The display module of claim 3, wherein each of the one or more mounting hooks are positioned proximate a bottom edge of the second face.

12. The display module of claim 3, wherein the one or more securing structures are configured to engage one or more features of the support structure.

13. The display module of claim 3, wherein the one or more mounting hooks are each configured to engage an opening in the support structure.

14. The display module of claim 3, further comprising one or more translating structures coupled to the second face, each translating structure configured to engage a feature of the support structure to effectuate a translation of the display module to avoid contact or interference with an adjacently-positioned display module also mounted to the support structure, during a mounting or a dismounting procedure.

15. The display module of claim 14, wherein the one or more mounting hooks at least partially support the display module when the one or more translating structures effectuate the translation of the display module.

16. The display module of claim 10, wherein each of the one or more mounting hooks are positioned proximate a bottom edge of the second face.

17. The display module of claim 10, wherein the one or more securing structures are configured to engage one or more features of the support structure.

18. The display module of claim 10, wherein the one or more mounting hooks are each configured to engage an opening in the support structure.

19. The display module of claim 10, further comprising one or more translating structures coupled to the second face, each translating structure configured to engage a feature of the support structure to effectuate a translation of the display module to avoid contact or interference with an adjacently-positioned display module also mounted to the support structure, during a mounting or a dismounting procedure.

20. The display module of claim 19, wherein the one or more mounting hooks at least partially support the display module when the one or more translating structures effectuate the translation of the display module.

* * * * *